United States Patent [19]

Logan

[11] Patent Number: 5,146,571
[45] Date of Patent: Sep. 8, 1992

[54] REMAPPING DEFECTS IN A STORAGE SYSTEM THROUGH THE USE OF A TREE STRUCTURE

[75] Inventor: Donald G. Logan, Blackstone, Mass.

[73] Assignee: EMC Corporation, Hopkington, Mass.

[21] Appl. No.: 488,454

[22] Filed: Feb. 26, 1990

Related U.S. Application Data

[63] Continuation of Ser. No. 173,982, Mar. 28, 1988, abandoned.

[51] Int. Cl.$^5$ .............................................. G06F 11/22
[52] U.S. Cl. ................................ 395/400; 364/265; 364/296.3; 364/256.3; 364/255.2; 364/DIG. 1; 371/10.1
[58] Field of Search ... 364/200 MS File, 900 MS File; 371/2.2, 10.1, 10.2, 10.3, 21.6, 29.1, 40.3, 40.1

[56] References Cited

U.S. PATENT DOCUMENTS

| | | | |
|---|---|---|---|
| 4,020,466 | 4/1977 | Cordi et al. | 364/200 |
| 4,086,628 | 4/1978 | Woodrum | 364/200 |
| 4,241,420 | 12/1980 | Fish et al. | 364/900 |
| 4,434,487 | 2/1984 | Rubinson et al. | 364/200 |
| 4,479,214 | 10/1984 | Ryan | 371/22 |
| 4,498,146 | 2/1985 | Martinez | 364/900 |
| 4,656,532 | 4/1987 | Greenberg | 360/49 |
| 4,746,998 | 5/1988 | Robinson | 360/49 |
| 4,805,048 | 2/1989 | Takeuchi | 360/69 |
| 4,811,124 | 3/1989 | Dujari | 360/49 |
| 4,868,789 | 9/1989 | MacDonald | 371/10.1 |

OTHER PUBLICATIONS

The Art of Computer Programming, vol. 3, Sorting and Searching, Knuth, Donald E., Addison Wesley Pub. Co. 1973, pp. 406–415.

R. Sedgewick, "Algorithms," Addison-Wesley Publishing Company, Inc., Reading, Mass., 1983, pp. ii-—551.

Primary Examiner—Thomas C. Lee
Assistant Examiner—Eric Coleman
Attorney, Agent, or Firm—Weingarten, Schurgin, Gagnebin & Hayes

[57] ABSTRACT

A method and apparatus are disclosed for mapping a logical address generated by a device seeking access to a storage media into a corresponding physical address to create the appearance that all good addresses consitute a continuous defect free address space in the storage medium. A tree structure is created based upon known defective addresses in the storage medium. The upper levels of the tree are selectively loaded with decisional criteria which are employed to branch downward to an offset value stored in the lowest tree level. The respective offset value is added to the logical address to produce the desired physical address of the storage media for access. The tree is traversed each time an address is presented to map the requested logical address into a physical address corresponding to a location in the storage device for access. The media thus appears to the requesting device to be a continuous defect free address space with defective addresses congregated at the end of the address space, thereby avoiding the need for the requesting device to fragment files due to media defects.

20 Claims, 22 Drawing Sheets

DEFECTS IDENTIFIED BY MANUFACTURE

| 0 | 1 | 2 | 3 | 4 | 5 | 6 | 7 | 8 | 9 |
|---|---|---|---|---|---|---|---|---|---|
| 4 | 7 | 8 | 9 | 12 |   |   |   |   |   |

*FIG. 4A*

ADDITIONAL DEFECTS

| 0 | 1 | 2 | 3 | 4 | 5 | 6 | 7 | 8 | 9 |
|---|---|---|---|---|---|---|---|---|---|
| 2 | 3 | 16 |  |   |   |   |   |   |   |

*FIG. 4B*

MERGED DEFECT LIST

| 0 | 1 | 2 | 3 | 4 | 5 | 6 | 7 | 8 | 9 |
|---|---|---|---|---|---|---|---|---|---|
| 6 | 7 | 8 | 9 | 12 | 3 | 16 |   |   |   |

*FIG. 4C*

SORTED (FINAL) DEFECT LIST

| 0 | 1 | 2 | 3 | 4 | 5 | 6 | 7 | 8 | 9 |
|---|---|---|---|---|---|---|---|---|---|
| 6 | 3 | 7 | 8 | 9 | 12 | 16 |   |   |   |

*FIG. 4D*

SORT VARIABLES

| PASS | COUNT | I | TR | *TR | SAVETMP | TMP | *TMP | TMP+1 | *(TMP+1) |
|---|---|---|---|---|---|---|---|---|---|
| INITIALIZATION | 6 | | 0<br>1<br>2 | | | 0<br>1 | -1<br>7 | | |
| 1ST PASS | 6 | 1 | 2<br>3 | 8<br>9 | 1 | 1<br>2 | 7<br>0 | 2 | 8 |
| 2ND PASS | 6 | 2<br>3 | 3<br>4 | 9 | 1<br>2 | 2<br>3 | 0 | 3 | 9 |
| 3RD PASS | 6 | 2<br>3 | 4<br>5 | 12 | 2<br>3 | 3<br>4 | 9 | 4 | 12 |
| 4TH PASS | 6 | 3<br>4 | 5 | 3 | 3<br>4 | 4<br>3<br>2<br>1<br>0<br>5 | 12<br>9<br>0<br>7<br>-1 | 5<br>4<br>3<br>2<br>1 | 12<br>9<br>8<br>7<br>3 |
| 5TH PASS | 6 | 5<br>6 | 6<br>7 | 16 | 5 | 5<br>6 | 12 | 6 | 16 |
| MOVE TMP LIST TO TR LIST | 6 | 0<br>1<br>2<br>3<br>4<br>5<br>6 | 1<br>2<br>3<br>4<br>5<br>6 | 3<br>7<br>8<br>9<br>12<br>16 | | 1<br>2<br>3<br>4<br>5<br>6 | 7<br>7<br>8<br>9<br>12<br>16 | | |

FIG. 7

SORTED DEFECT LIST

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 6 | 3 | 7 | 8 | 9 | 12 | 16 | | | | | | | | |

MODIFIED DEFECT LIST

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 3 | 6 | 8 | 11 | | | | | | | | | | | |

OFFSET LIST

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 0 | 1 | 4 | 5 | 6 | | | | | | | | | | |

TREE LIST

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 4 | 3 | 6 | 8 | 11 | | | | | | | | | | |

*FIG. 8*

RESTRUCTURE LIST VARIABLES

| PASS | I | N | *COUNT | ADDS | START | ENDS | TR | *TR | TNP | *TNP | ER | *ER |
|---|---|---|---|---|---|---|---|---|---|---|---|---|
| INITIALIZATION | 0 | 6 | 0 | 0 | 0 | 0 |  | 3 | 0 |  | 0 | 0 |
| 1ST PASS | 0,1 | 6 | 0,1 | 0,1 | 0,3 | 0,2 | 1,2 | 3 | 0,1 | 3 | 0,1 | 1 |
| 2ND PASS | 1,2 | 6 | 1,2 | 1,2 | 3,6 | 2,5 | 2,3 | 7 | 1,2 | 6 | 1,2 |  |
| 3RD PASS | 2,3 | 6 | 2 | 2,3 | 6 | 5 | 3,4 | 8 | 2 |  | 2 |  |
| 4TH PASS | 3,4 | 6 | 2 | 3,4 | 6 | 5 | 4,5 | 9 | 2 |  | 2,3 | 4 |
| 5TH PASS | 4,5 | 6 | 2,3 | 4,5 | 6,8 | 5,7 | 5,6 | 12 | 2,3 | 8 | 2,3 |  |
| 6TH PASS | 5,6 | 6 | 3,4 | 5,6 | 8,11 | 7,10 | 6,7 | 16 | 3,4 | 11 | 3,4 | 5 |
| INITIALIZATION | 0 | 4 |  |  |  |  | 1 | 3 | 0 | 3 | 4 | 6 |
| 1ST PASS | 0,1 | 4 |  |  |  |  | 1,2 | 3 | 0,1 |  |  |  |
| 2ND PASS | 1,2 | 4 |  |  |  |  | 2,3 | 6 | 1,2 | 6 |  |  |
| 3RD PASS | 2,3 | 4 |  |  |  |  | 3,4 | 8 | 2,3 | 8 |  |  |
| 4TH PASS | 3,4 | 4 |  |  |  |  | 4,5 | 9,11 | 3,4 | 11 |  |  |

BUILD TREE VARIABLES

| PASS | COUNT | N | I | J | NUMPAIRS | L(I) | R(I) | TL(J) TR(J) | MID | TMP | *TMP (TMP) | *A (TR) | B *B | TR |
|---|---|---|---|---|---|---|---|---|---|---|---|---|---|---|
| INITIALIZATION | 0 | 4 | | | | L(1)=1 R(1)=4 | | | | | | | | 11 |
| | 0 | 4 | | | 1 | L(1)=1 R(1)=4 | | | | | | | | 0 |
| 1 | 1 | | 1 | 1 | | | | TL(1)=1 TR(1)=2 | 2 | | 1 | 6 | 6 | |
| | | | 2 | 2 | | | | TL(2)=3 TR(2)=4 | | | | | 2 | |
| | | | 3 | 2 | 2 | L(1)=1 R(1)=1 | | | | | | | 6 | |
| | | | | | | L(2)=3 R(2)=4 | | | | | | | | |
| 2 | | | 1 | 1 | | | | TL(1)=1 TR(1)=0 | 1 | | 2 | 3 | 1 | 3 |
| 3 | | | 2 | 2 | | | | TL(2)=2 TR(2)=1 | | | 3 | 8 | 3 | 8 |
| | | | 3 | 3 | | | | TL(3)=3 TR(3)=2 | 3 | | | | | |
| | | | 4 | 4 | | | | TR(4)=4 | | | | | | |
| 4 | | | | | 4 | L(1)=0 R(1)=1 | | | | | | | | |
| 5 | | | | | | L(2)=2 R(2)=1 | | | | | | | | |
| 6 | | | | | | L(3)=3 R(3)=2 | | | | | | | | |
| | | | | | | L(4)=4 R(4)=4 | | | | | | | | |
| | | | 1 | 1 | | | | TL(1)=4 TR(1)=3 | 4 | | 7 | 11 | 4 | 11 |
| 7 | | | 2 | 3 | | | | TL(2)=5 TR(2)=4 | | | | | | |
| | | | 3 | 2 | | | | | | | | | | |
| | | | | | 8 | L(1)=4 R(1)=3 | | | | | | | | |
| | | | | | | L(2)=5 R(2)=4 | | | | | | | | |

*FIG. 14*

FILL TREE VARIABLES

| PASS | I | J | L | N | TMP (TREE) | *TMP | TR (MOD) | *TR | WHERE (MOD) | TMP+L | *(TMP+L) | TMP+J | *(TMP+J) | ER | *ER |
|---|---|---|---|---|---|---|---|---|---|---|---|---|---|---|---|
| INIT. | 0 |   | 4 | 1 |   | 0 |   |   |   |   |   |   |   | 0 | 0 |
| PASS 1 |   |   |   |   |   |   | 1 | 3 | 3 |   |   |   |   |   |   |
|   | 1 |   |   |   | 0 |   | 2 | 6 |   |   |   | 1 | 6 |   |   |
|   |   | 2 |   |   |   |   |   |   |   |   |   | 2 | 3 |   |   |
|   |   |   |   |   | 4 |   |   |   |   |   |   | 4 | -1 |   |   |
|   |   |   |   |   |   |   |   |   |   |   |   | 4 | 3 |   |   |
|   |   |   |   |   | 8 |   |   |   |   |   |   | 8 | -1 |   |   |
|   |   |   |   |   |   |   |   |   |   |   |   | 8 | 3 |   |   |
|   |   |   |   |   | 16 |   |   |   |   |   |   | 16 | -1 |   |   |
|   |   |   |   |   |   |   |   |   |   |   |   | 16 | 3 |   |   |
|   |   |   |   |   | 32 |   |   |   |   |   |   | 32 | -1 |   |   |
|   |   |   |   |   |   |   |   |   |   |   |   | 32 | 3 |   |   |
|   |   |   |   |   | 64 |   |   |   |   |   |   | 64 | -1 |   |   |
|   |   |   |   |   |   |   |   |   |   |   |   | 64 | 3 |   |   |
|   |   |   |   |   | 128 |   |   |   |   |   |   | 128 | 0 |   |   |
|   |   |   |   |   |   |   |   |   |   |   |   | 128 | 0 | 1 | 1 |
|   |   |   |   |   | 5 |   |   |   |   |   |   | 5 | -1 |   |   |
|   |   |   |   |   |   |   |   |   |   |   |   | 5 | 3 |   |   |
|   |   |   |   |   | 11 |   |   |   |   |   |   | 11 | -1 |   |   |
|   |   |   |   |   |   |   |   |   |   |   |   | 11 | 3 |   |   |
|   |   |   |   |   | 23 |   |   |   |   |   |   | 23 | -1 |   |   |
|   |   |   |   |   |   |   |   |   |   |   |   | 23 | 3 |   |   |
|   |   |   |   |   | 47 |   |   |   |   |   |   | 47 | -1 |   |   |
|   |   |   |   |   |   |   |   |   |   |   |   | 47 | 3 |   |   |
|   |   |   |   |   | 95 |   |   |   |   |   |   | 95 | -1 |   |   |
|   |   |   |   |   |   |   |   |   |   |   |   | 95 | 3 |   |   |
|   |   |   |   |   | 191 |   |   |   |   |   |   | 191 | 0 |   |   |
|   |   |   |   |   |   |   |   |   |   |   |   | 191 | 1 | 2 | 4 |
| PASS 2 | 1 |   | 1 |   | 0 |   | 3 | 8 | 6 | 1 | 6 |   |   |   |   |
|   |   | 2 |   |   |   |   |   |   |   |   |   | 2 | 3 |   |   |
|   |   | 5 |   |   |   |   |   |   |   |   |   | 5 | 3 |   |   |
| PASS 3 | 2 |   | 1 |   | 0 |   | 4 | 11 | 8 | 1 | 6 |   |   |   |   |
|   |   | 2 |   |   |   |   |   |   |   |   |   |   |   |   |   |
|   |   | 3 |   |   |   |   |   |   |   |   |   | 3 | 8 |   |   |
|   |   |   |   |   | 6 |   |   |   |   |   |   | 6 | -1 |   |   |
|   |   |   |   |   |   |   |   |   |   |   |   | 6 | 8 |   |   |
|   |   |   |   |   | 12 |   |   |   |   |   |   | 12 | -1 |   |   |
|   |   |   |   |   |   |   |   |   |   |   |   | 12 | 8 |   |   |
|   |   |   |   |   | 24 |   |   |   |   |   |   | 24 | -1 |   |   |
|   |   |   |   |   |   |   |   |   |   |   |   | 24 | 8 |   |   |
|   |   |   |   |   | 48 |   |   |   |   |   |   | 48 | -1 |   |   |
|   |   |   |   |   |   |   |   |   |   |   |   | 48 | 8 |   |   |
|   |   |   |   |   | 96 |   |   |   |   |   |   | 96 | -1 |   |   |
|   |   |   |   |   |   |   |   |   |   |   |   | 96 | 8 |   |   |
|   |   |   |   |   | 192 |   |   |   |   |   |   | 192 | 0 |   |   |
|   |   |   |   |   |   |   |   |   |   |   |   | 192 | 1 | 3 | 5 |
|   |   |   |   |   | 7 |   |   |   |   |   |   | 7 | 11 |   |   |

FIG. 18
PAGE 1

FILL TREE VARIABLES

| PASS | T | J | L | N:(TREE) | TMP *TMP:(NOD) | TR *TR:(NOD) | WHERE TMP+L *(TMP+L) | TMP+J *(TMP+J) | ER *ER |
|---|---|---|---|---|---|---|---|---|---|
| PASS 3 | 3 | 1 | | 0 | 5 | ? | 1 | 6 | |
| PASS 4 | | 2 | | | | | 3 | 8 | |
| | | 3 | | | | | 7 | 11 | |
| | | 6 | | | | | | | |
| | | 7 | | | | | | | |
| | 14 | | | | | | 14 =-1 | 14 =-1 | |
| | 28 | | | | | | 28 =-1 | 28 =-1 | |
| | 56 | | | | | | 56 =-1 | 56 =-1 | |
| | 112 | | | | | | 112 =-1 | 112 =-1 | |
| | 224 | | | | | | 224 =0 | 224 =5 | 4 |
| | 15 | | | | | | 15 =-1 | 15 =-1 | |
| | 31 | | | | | | 31 =-1 | 31 =-1 | |
| | 63 | | | | | | 63 =-1 | 63 =-1 | |
| | 127 | | | | | | 127 =-1 | 127 =-1 | |
| | 255 | | | | | | 255 =0 | 255 =6 | 6 |
| RETURN 4 | | | | | | | | | |

FIG. 18
PAGE 2

FIG. 19

| PASS | LOOP VARIABLE (I) | LOGICAL ADDRESS (00) | SEARCH VARIABLES POINTER TO 1ST TREE LOC (A0) | INDEX (DI) | TREE ADDRESS (A0+DI-1) | VALUE AT TREE ADDRESS *(A0+DI-4) | PHYSICAL ADDRESS (PA) |
|---|---|---|---|---|---|---|---|
| INITIALIZATION | 7 | 9 | 1 | 1 | — | — | — |
| PASS 1 | 7<br>6 | 9 | 1 | 1<br>2<br>3 | 1 | 6<br>6 | 6 |
| PASS 2 | 6<br>5 | 9 | 1 | 3<br>6<br>7 | 3 | 0 | — |
| PASS 3 | 5<br>4 | 9 | 1 | 7<br>14 | 7 | 11 | — |
| PASS 4 | 4<br>3 | 9 | 1 | 14<br>28 | 14 | 11 | — |
| PASS 5 | 3<br>2 | 9 | 1 | 28<br>56 | 28 | 11 | — |
| PASS 6 | 2<br>1 | 9 | 1 | 56<br>112 | 56 | 11 | — |
| PASS 7 | 1<br>0 | 9 | 1 | 112<br>224 | 112 | 11 | — |
| EIGHTH LEVEL | | 9 | 1 | 224 | 224 | 5 | 14 |

*FIG. 22*

REMAPPING DEFECTS IN A STORAGE SYSTEM THROUGH THE USE OF A TREE STRUCTURE

This application is a continuation of application Ser. No. 07/173,982, filed Mar. 28, 1988, now abandoned.

FIELD OF THE INVENTION

This invention relates to computer systems and more particularly to a method and apparatus for remapping and addressing storage media to create the appearance to a device requesting access to the media that the media contains a large continuous defect free address space.

BACKGROUND OF THE INVENTION

A disk drive is a storage device often employed in computer systems where storage of large quantities of data is required. Large capacity disk drives typically include several platters or disks. Each side of each platter may be coated with a magnetic oxide material on which data may be stored. A read/write head disposed adjacent each side of each platter detects or creates magnetic flux changes in the oxide in order to read information from the disk or alternatively to write data to the disk. The heads are typically affixed to a common structure which, under control of the disk system, permits the heads to be selectively positioned at a selected radius between the inner and outer diameters of the disk. The heads may be stepped along the selected radius. The radius of each "step" of the heads defines a circular track on the rotating disk on which information may be stored. Typically, by convention, track $\phi$ is located at the outer working diameter of the platter and the highest track number is located at the inner working diameter with track numbers increasing sequentially in number therebetween.

The heads are stacked vertically and all such heads move together. Thus, if one head must be moved to access data on a certain track, all other connected heads move in unison and are positioned above the same track on the respective platter surface. All tracks on the respective platter surfaces that can be accessed without stepping the heads define a cylinder. Some drives are constructed with multiple heads per platter surface.

Tracks are further subdivided into smaller information containing units called sectors. The number of sectors on a track depends on the particular type of disk drive employed.

The address of any sector on a disk drive may thus be uniquely specified by a cylinder number, a head number and sector number. For example, the first sector on a drive is located at cylinder $\phi$ head $\phi$ and sector $\phi$.

Certain computer operating systems do not employ cylinder, head and sector addressing for disk drives but instead view the drive as one continuous address space; the address of the first sector being $\phi$ and the address of the last sector being N−1 where N equals the total number of sectors on the drive. In such systems, a disk controller converts addresses generated by the operating system into a physical address corresponding to the cylinder, head and sector addresses needed to access a specific sector on the storage media. Some operating systems in current use are more efficient when using disk systems with a large, continuous defect free address space.

When an operating system prepares to store a file to a disk drive, it typically first looks for a continuous address space of sufficient size to accommodate the entire file. If such a space does not exist, the file must be fragmented into a number of smaller segments each of which can fit within the address spaces available on the disk. The process of fragmenting a file is time consuming and decreases the performance of the system. Moreover, many programs and systems prevent a file from being severed into more than a specified number of segments. The unavailability of a sufficient number of address spaces of a size sufficient to accommodate the file may preclude the system from running an application. The above Problem is apparent, for example, with large word processing files and in data base files which may occupy tens of thousands of sectors. The presence of a relatively small number of randomly spaced defects in the storage media of a disk drive may render a system unuseable for such large word processing and data base files.

The continuous trend of decreasing the physical size of disk drives while attempting to pack data ever more densely makes it increasingly more difficult and more costly to provide defect free media. Typical disk drives of 500 to 800 megabyte capacity which are commercially available generally have between 30 and 300 defects per drive. In such drives, the largest continuous defect free address space is typically between 10,000 and 30,000 sectors in length. While the prices of such drives are commercially attractive, the amount of fragmentation introduced as a consequence of media defects may render such drives unacceptable in applications employing large data files.

SUMMARY OF THE INVENTION

In accordance with the present invention a method and apparatus are disclosed for remapping addresses in a storage controller to create the appearance that the storage media includes a large continuous defect free address space. In use, a source requesting access to the storage media (such as an operating system) presents a logical address to the storage controller. The controller, in real time, obtains an offset value which is added to the logical address to produce a linear physical address corresponding to a specific cylinder, head and sector address for access. The conversion from the logical address to the physical address is achieved through the use of a tree structure which permits mapping of the addresses in real time with minimal degradation of system performance.

As described below, the tree structure is first created. A list identifying disk drive defects by cylinder, head and sector is typically generated by the device manufacturer and is stored in a predetermined area on the storage media. The list of defects detected by the manufacturer and stored on the media is read by the storage controller and stored after converting the defect information from the cylinder/head/distance from index mark/length format stored on the disk to a linear physical address format. The defect list includes as the first element thereof a value indicating the number of defects in the list.

Subsequent to the identification of defective sectors by the manufacture, and the storage of defect identifying information on the media, additional sectors may become defective for a number of reasons. A list of the additional defective sectors, identified by their respective linear physical address is generated. The list of additional defective sectors is merged with the list of defects identified by the manufacturer by appending the additional defective sector list to the list representing defects detected by the manufacturer. The first element of the merged list is updated to reflect the total number of defective sectors identified in the merged list.

The merged list of defects is next sorted to produce a final defect list in which the defects appear in ascending order by linear physical address. The first element of the final or sorted defect list contains a value corresponding to the total number of defective addresses included in the list. This final defect list is a list employed to generate the tree structure.

The final defect list is used to produce two additional lists; a modified defect list and an offset list. The values in the modified defect list are employed to determine the value in the offset list which must be added to a respective logical address to produce a corresponding linear physical address for access.

Following generation of the modified defect list and the offset list a multi-level tree structure is created. The values from the modified defect list are selectively loaded into the upper levels of the tree. The upper levels of the tree are herein defined to include all but the lowest tree level.

The upper levels of the tree include decisional criteria used while searching the tree as hereinafter described. The offset values from the offset list are selectively loaded into the lowest tree level.

Upon presentation of a logical address by a requesting source, such as an operating system, the storage controller traverses the tree structure, successively comparing the logical address presented with the values stored in selected upper level tree elements. The controller branches downward through the upper levels of tree structure based upon the logical result of each comparison. The traversing operation terminates after branching through the upper tree levels to the lowest tree level. The respective element in the lowest tree level contains an offset value which is added to the logical address to produce the linear physical address for access by the controller.

Each time a logical address is presented to the storage controller, the tree is traversed in the above described manner to ascertain the corresponding linear physical address. The linear physical address is converted to the address format required by the storage system, such as the cylinder, head and sector format recognized by the disk system in the case of a disk drive, and the specific physical address in the media is then accessed.

The tree structure produced as herein described may be traversed within the sector access time of a disk drive. Thus, no degradation in performance is observable for multiple sector accesses except on the first sector access. By mapping the logical addresses into physical addresses in accordance with the present invention, all good sectors appear to be contiguous and to be located at the lowest media addresses. Defective sectors appear to be grouped at the end of the drive irrespective of the number of defective sectors in the media. Furthermore, the mapping apparatus presently described is completely transparent to the requesting source (i.e. the operating system). By employing the present invention the Problems associated with the fragmentation of files and the inability to run applications employing large files as a consequence of randomly spaced media defects are overcome.

BRIEF DESCRIPTION OF THE DRAWINGS

These and other features of the invention are more fully set forth in the detailed description and accompanying drawings of which:

FIG. 4a is an exemplary list of physical addresses corresponding to defective addresses identified by the manufacturer of a storage device;

FIG. 4b is an exemplary list of physical addresses corresponding to defective addresses in addition to those illustrated in FIG. 4a;

FIG. 4c is an exemplary defect list illustrating the appending of the defects identified in the list of FIG. 4b to the list of defects identified in FIG. 4a;

FIG. 4d is an illustration of the merged defect list of FIG. 4c after sorting the list to arrange the defective addresses in ascending order;

FIG. 7 is a chart showing the values of the memory tables and registers in the flow diagram of FIG. 5 as applied to the exemplary merged defect list illustrated in FIG. 4c to obtain the sorted (final) defect list shown in FIG. 4d;

FIG. 8 is a chart depicting the restructuring of the sorted defect list to create a modified defect list and an offset list in accordance with the present invention;

FIG. 11 is a chart showing the values of memory tables and registers in the flow diagram of FIG. 9 when restructuring the exemplary sorted defect list illustrated in FIG. 4d;

FIG. 12a is an illustration of a memory table organized in the form of a tree structure in accordance with the present invention after partially completing the build tree operation illustrated in FIG. 13 but prior to filling the tree with decisional criteria from the modified defect and with offset values from the offset list;

FIG. 12b is an illustration of a memory table organized in the form of a tree structure built in accordance with the build tree operation illustrated in FIG. 13 and employing the exemplary modified defect list data shown in FIG. 8;

FIG. 14 is a chart illustrating the values of memory tables and memory registers in the flow diagram of FIG. 14 when building a tree with the exemplary tree list illustrated in FIG. 8;

FIG. 18 is a two (2) page chart illustrating the values of memory tables and memory registers in the flow diagram of FIG. 16 when filling a tree employing the illustrative tree list and offset list of FIG. 8;

FIG. 19 illustrates a memory table organized in the form of the tree structure after having filled the tree with exemplary decisional criteria and offset values from the tree list and offset list of FIG. 8;

FIG. 22 is a chart showing the values of memory tables and registers in the process of mapping a logical address into a physical address in accordance with the present invention.

DETAILED DESCRIPTION OF THE INVENTION

Figure 1:
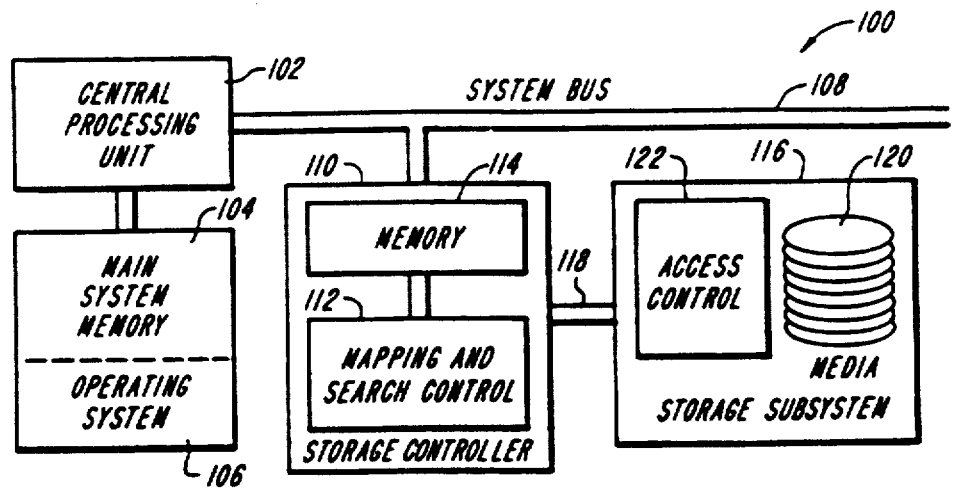
FIG. 1 is a system block diagram including a storage controller in accordance with the present invention.

In accordance with the present invention, a method and apparatus are disclosed for mapping addresses in a storage controller so as to create the appearance to a device requesting access to the storage media, that the media includes a large continuous defect-free address space. As illustrated in FIG. 1, a typical data processing system 100 includes, inter alia. a central processing unit 102 which executes instructions out of system memory 104. The system memory 104 may contain an operating system 106. The central processing unit 102 interfaces over a system bus 108 to a storage controller 110. The storage controller, in accordance with the present invention, includes mapping and search control logic 112 and associated memory 114. The storage controller 110 interfaces to a storage subsystem 116 over a storage subsystem interface bus 118. The storage subsystem 116 includes storage media 120 and access control logic 122 for accessing information on the storage media 120. The storage subsystem 116 may include a disk drive or any other randomly addressable storage media in which information is stored in sectors or addresses and which may be characterized by linear physical addresses.

When a requesting device, such as the operating system 106 associated with the central processing unit 102 or any other requesting device (not shown) attached to the system bus 108 desires to access the storage media, it transmits a logical address over the system bus 108 to the storage controller 110. The logical addresses are sequential in address space and extend from the lowest media address to the highest media address accessible.

The storage controller 110 receives the transmitted logical address and converts the logical address into a physical address corresponding to that required by the storage subsystem 116 to access the media. The physical address is transmitted over the storage subsystem interface bus 118 to the storage subsystem 116 along with any other applicable command or data information. The manner in which the storage controller 110 maps the logical address into a physical address is described in detail below.

Figure 2:
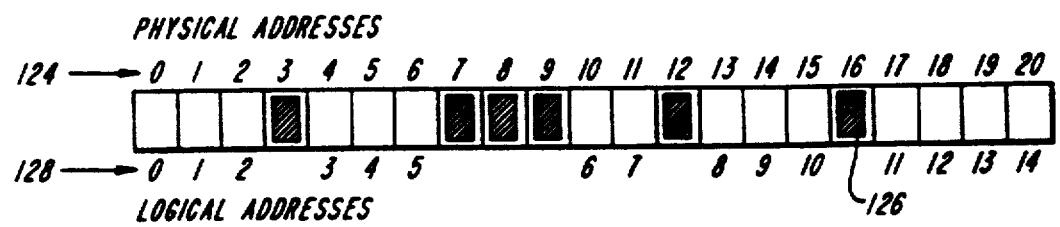
FIG. 2 is an illustration depicting the mapping of logical addresses into linear physical addresses.

FIG. 2 illustrates the physical addresses 124 corresponding to the sequential addresses on the storage media 120. For example, physical address 0 would correspond to cylinder 0, head 0 and sector 0 on a typical disk drive. Physical addresses 3, 7, 8, 9, 12 and 16 in FIG. 2 are illustrated as being defective. The defective addresses are so identified by the darkened blocks 126 associated with the defective physical addresses. To create the appearance that the non-defective media addresses constitute a continuous defect-free address space at the beginning of the media with defective addresses located at the end of the address space, logical addresses 128 are defined so as to selectively map into non-defective physical addresses. Thus, in the example illustrated in FIG. 2, logical addresses 0–2 map into physical addresses 0–2, logical addresses 3–5 map into physical addresses 4–6, logical addresses 6–7 map into physical addresses 10–11, logical addresses 8–10 map into physical addresses 13–15 and logical addresses 11 et. seq. map into physical addresses 17 et. seq. respectively. As is apparent from FIG. 2, the logical addresses are mapped into physical addresses by adding to the respective logical address the number of defects appearing prior to the requested logical address to obtain the corresponding physical address. For example, since one defect appears prior to logical address 3, the physical address 4 is obtained by adding the value 1 (corresponding to the defect at physical address 3) to the logical address 3 to obtain the physical address 4. Likewise, since five defects appear prior to logical address 8, by adding the value 5 to the logical address 8, the corresponding physical address 13 is obtained.

In accordance with the present invention, the mapping of logical address into physical addresses is achieved via use of a novel tree structure. In operation, when the storage controller 110 is presented with a logical address 128, the controller traverses the tree structure to arrive at the applicable offset value which is added to the logical address to obtain the respective physical address 124 for access.

Figure 3:
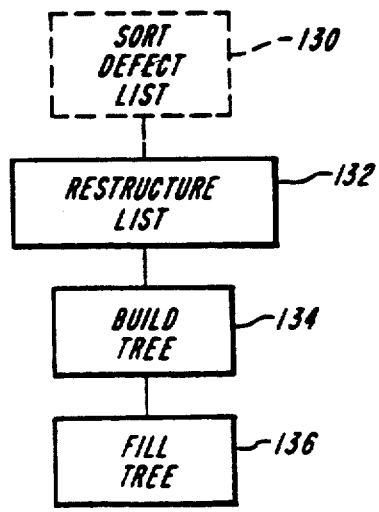
FIG. 3 is a top level block diagram illustrating the method and apparatus for creating the tree structure employed in accordance with the present invention.

A general flow diagram for producing a tree structure of the type employed in the present invention is illustrated in FIG. 3. Optionally, two or more defect lists identifying defective physical addresses or sectors on the storage media are sorted as illustrated in block 130. As a consequence of the sort operation, a single defect list is produced. The first element of the sorted defect list obtained as a result of the operation illustrated by block 130 is a value identifying the number of defective physical addresses or sectors on the media. The specific physical addresses of the defective media follow the value identifying the number of defects. The physical addresses of defective media locations appear in ascending order by linear physical address following the sort operation illustrated in block 130.

Following the sort operation illustrated in block 130, the sorted defect list is restructured, as illustrated in block 132 to produce two additional lists; namely, a modified defect list and an offset list. The modified defect list includes decisional criteria which are selectively loaded into locations of a memory table corresponding to elements in the upper levels of the tree structure in a manner hereinafter described. The offset list includes offset values which are selectively loaded into locations of the memory table corresponding to elements in the lowest level of the tree structure. The offset values correspond to the values which are employed in the mapping operation and which, when added to the logical address, produce a corresponding physical address employed for access of the storage media.

For ease of explanation memory tables are typically described as commencing with address 0. It is understood by those of ordinary skill that such starting addresses of tables employed may be positioned at any desired location in the storage controller memory 114 or alternatively in a dedicated memory.

In the build tree operation illustrated in block 134 the memory table corresponding in general to the tree structure employed in the present invention is created. In the illustrative embodiment disclosed, the memory table locations corresponding to all but the lowest level of the tree are initially filled with the value minus one (−1). The memory table locations corresponding to the elements in the lowest level of the tree are filled with zeros. Thereafter, the values from the modified defect list are selectively loaded into the memory table locations corresponding to elements in the upper levels of the tree.

Finally, in the fill tree operation illustrated in block 136, the tree structure is completed by propagating the modified defect list values appearing in the tree downward to, but not through the memory table locations corresponding to the lowest level of the tree. The offset values are then selectively loaded into the memory table locations corresponding to the lowest level of the tree to complete the tree structure.

After completing the creation of the tree structure in the manner described above, the storage controller 110 and more particularly, the mapping and search control logic 112, traverses the memory table organized as a tree structure each time a logical address is presented to the storage controller to obtain the applicable offset value in order to produce the desired physical address on the storage media 120. The specific method and apparatus employed for creating and using a tree structure in accordance with the present invention is described in further detail below.

FIGS. 4a through 4d are illustrative of one approach for producing a sorted (final) defect list for use in accordance with the present invention.

Due to the difficulty and cost associated with the production of defect-free media, as has been previously noted, it is common for storage media to include defects. More specifically, many manufacturers of disk drives store information in known good media locations which define the physical addresses of defective sectors.

Defect data is often stored on disk drives in well-known media defect formats, one of which is known in the art as the NEC extended format. The storage controller 110 reads the defect information from the media 120 to produce a defect list such as illustrated in FIG. 4a. The first element in the list identifies the number of defective addresses or, in the case of a disk drive the number of defective sector addresses which follow. In the illustration of FIG. 4a, the value four (4) in the first location of the list indicates there are four defective physical addresses or sectors. The next four locations indicate that the physical addresses or sectors 7, 8, 9 and 12 are defective.

Subsequent to storage of defect-identifying information on the media by the manufacturer, it is possible for additional media locations to become defective. Such may result, for example, from media contamination or from head crashes in which a head physically contacts and destroys the underlying media surface. It is desirable to map out all defects including those identified by the manufacturer and those detected subsequent to storage of defect information on the media by the manufacturer. The operating system 106 typically maintains a list of additional defective sectors or addresses. The list of defects maintained by the operating system are logical addresses since the operating system is unaware of the specific physical addresses corresponding to any given defective logical address. The logical addresses are converted to physical addresses by traversing a memory table containing the then applicable tree structure to obtain the respective physical addresses. Additional defects are compiled in a list such as illustrated in FIG. 4b. As in the case of FIG. 4a, the first location of the additional defect list of FIG. 4b contains the number of defective physical addresses or sectors in the list. As illustrated in the example of FIG. 4b, there are two additional defective physical addresses, namely physical addresses 3 and physical address 16. It is noted that the physical addresses in the additional defect list of FIG. 4b will not equal any of the defective addresses identified in FIG. 4a since the mapping and search control logic 112 in the storage controller 110 remaps logical addresses so as to preclude access to the defective physical addresses.

As illustrated in FIG. 4c, a single merged defect list is created by appending the defective addresses in the additional defect list of FIG. 4b to the defect list illustrated in FIG. 4a. The first location of the merged defect list again identifies the number of defective physical addresses or sector addresses in the list.

Finally, as illustrated in FIG. 4d, a sorted or final defect list is produced by sorting the merged defect list to produce a list having defective physical addresses identified in ascending order by physical address. The merged defect list may be sorted to produce the final defect list via an insertion sort, a shell sort, a bubble sort or any other applicable sort technique known in the art.

Figure 5:
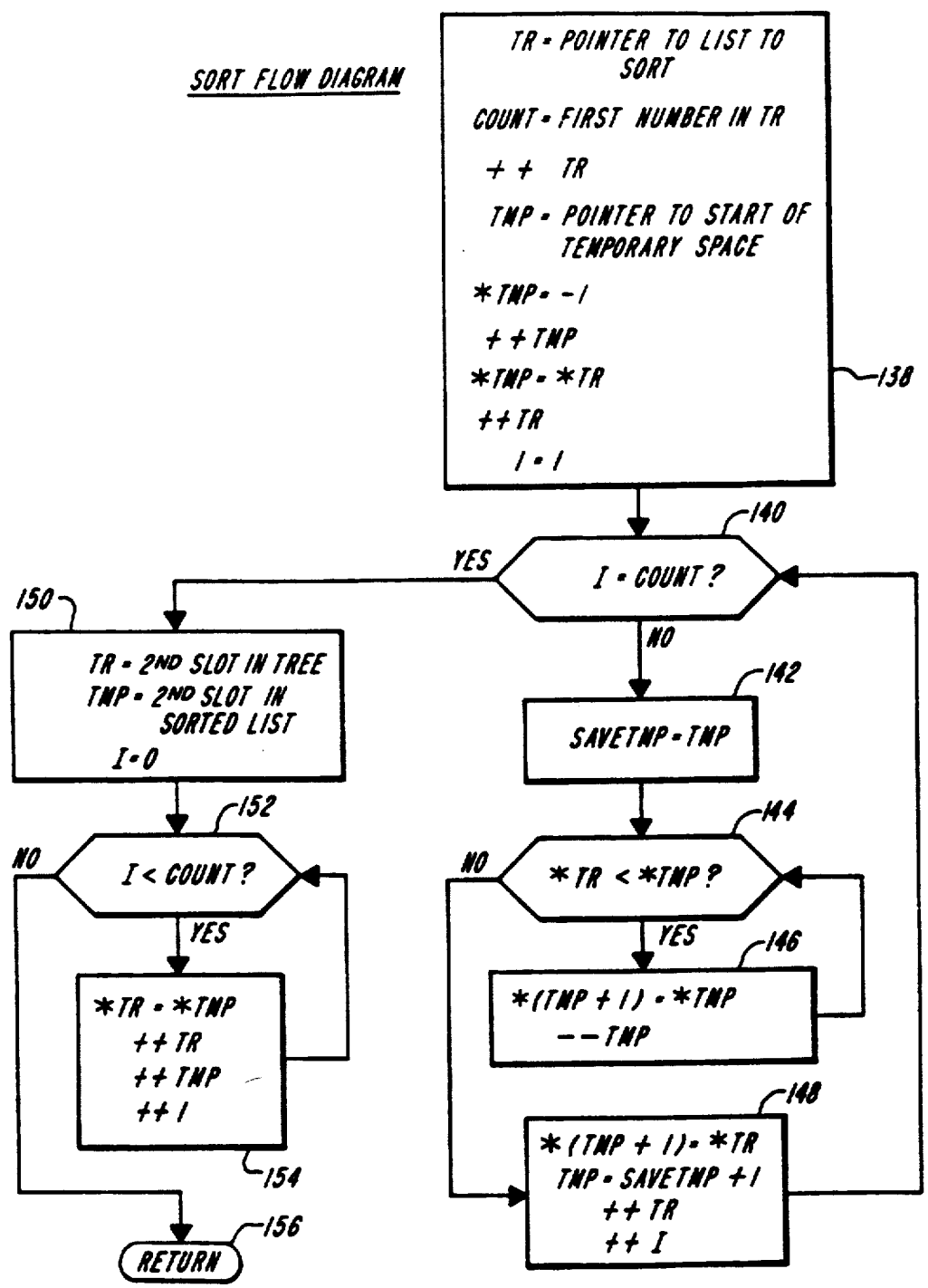
FIG. 5 is a flow diagram illustrating a method and apparatus for sorting the merged defect list to form the sorted defect list in accordance with the present invention.
Figure 6:
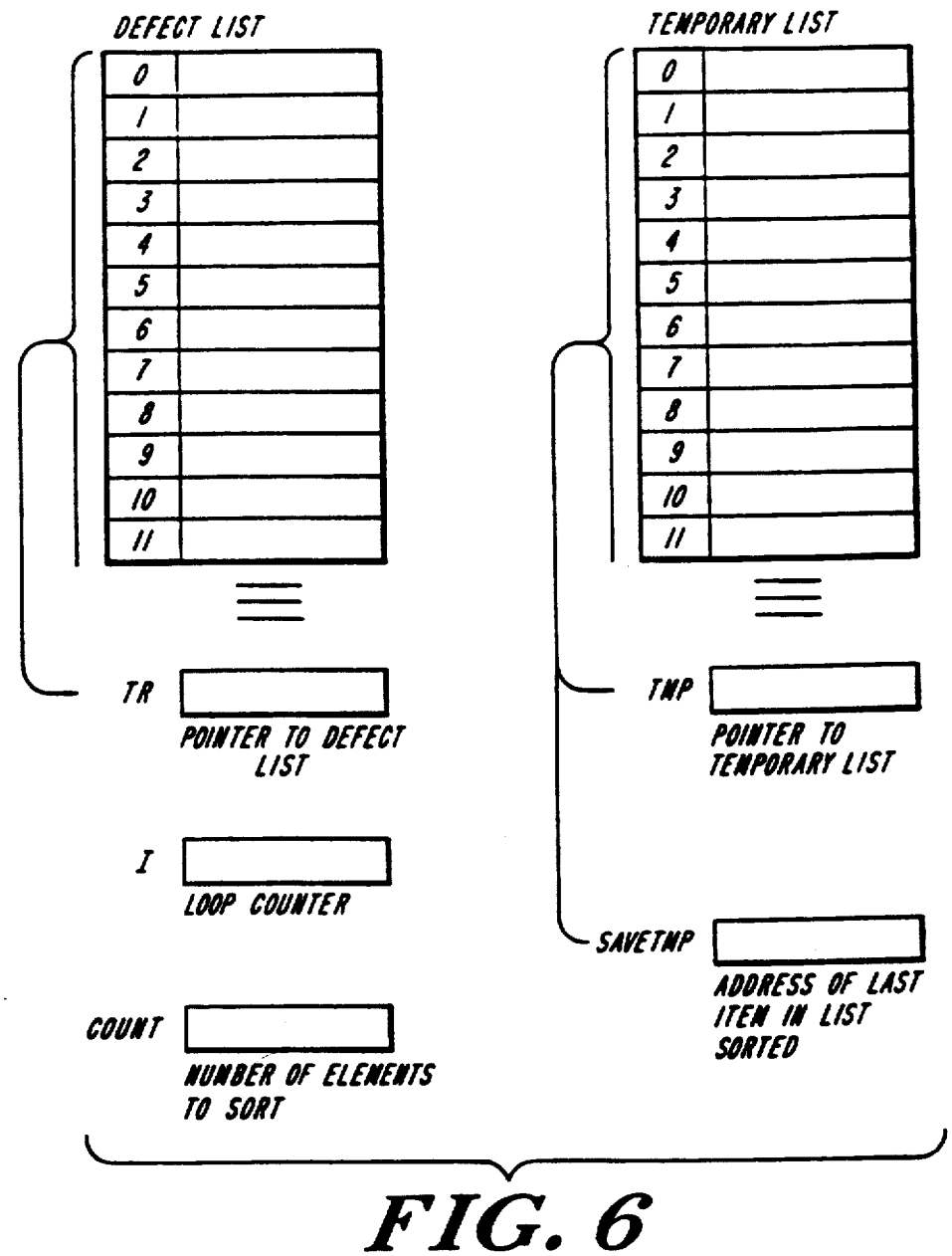
FIG. 6 illustrates memory tables and memory registers employed in accordance with the flow diagram shown in FIG. 5.

A method and apparatus for producing the sorted defect list from a merged defect list is illustrated in the sort flow diagram of FIG. 5. The memory tables and memory registers employed in sorting the merged defect list to produce the final defect list are illustrated in FIG. 6. As illustrated in block 138 the "TR" register is initialized to point to the first address of the list to sort. Thereafter, the register "count" is loaded with the value from the first location in the final defect list which is pointed by the "TR" register. The "TR" register is then incremented to point to the fist defective physical address in the merged defect list. A second address Pointer "TMP", is initialized to point to the start of a temporary memory table. The value minus one (−1) is stored in the first location of the temporary memory table and the address pointer "TMP" is then incremented to point to the next location, address 1, in the temporary memory table. The first defective physical address in the merged defect list is then stored in address 1 of the temporary list. The address pointer "TR" is then incremented to point to the second defective physical address in the merged defect list. A loop counter is next set to a value of 1 thus completing the initialization procedure of block 138. Thereafter, commencing with block 140 an insertion sort is performed in which successive defective physical addresses from the merged defect list are successively inserted in the proper location in the temporary list. The insertion sort of FIG. 5 is specifically illustrated in FIG. 7 where the values of the respective variables of the sort flow diagram of FIG. 5 are illustrated in transforming the exemplary merged defect list of FIG. 4c into the sorted defect list of FIG. 4d.

The sorted or final defect list produced in accordance with the sort flow diagram of FIG. 5 is next employed to produce a modified defect list and an offset list as illustrated in FIG. 8. The modified defect list and the offset list define the essential criteria and values used in forming the tree structure. The meanings of the values in the modified defect list and the offset list are apparent by way of example. The modified defect list and the offset list illustrated in FIG. 8 correspond to the lists produced upon restructuring of the sorted defect list. More specifically, referring to FIG. 8, the indication of the value of 3 in address 0 of the modified defect list means that if the logical address presented is less than 3, the offset value in the corresponding address of the offset list (address 0) is added to the logical address to produce the corresponding physical address. In this particular example, referring to FIG. 2, if the logical address is less than 3, there are no defects prior to the logical address and the offset value is 0. Address 1 of the illustrative modified defect list in FIG. 8 contains a value of 6. If the logical address presented to the storage controller 110 is less than 6 but greater than or equal to the prior value (3) the offset value in the corresponding address of the offset list (address 1) is added to the logical address to produce the corresponding physical address. Likewise, with respect to address 3 of the modified defect list in illustrative FIG. 8, if the logical address presented is less than 8 but greater than or equal to 6 the offset value 4 in the offset list address corresponding to the modified defect list address is added to the logical address to produce the respective physical address.

As illustrated in FIG. 8, the tree list is created by inserting in address 0 of the list the number of elements in the modified defect list and appending thereafter the elements from the modified defect list. The value in the first location of the tree list illustrated in FIG. 8 identifies the number of continuous defective segments on the media. If a number of successive addresses or sectors on the media are defective, the contiguous addresses constitute a single defective segment. Thus, by employing the present tree structure, the controller can map out far more sectors or addresses than the number of elements in the lowest level of the tree provided numbers of defective sectors or addresses are contiguous.

Figure 9:
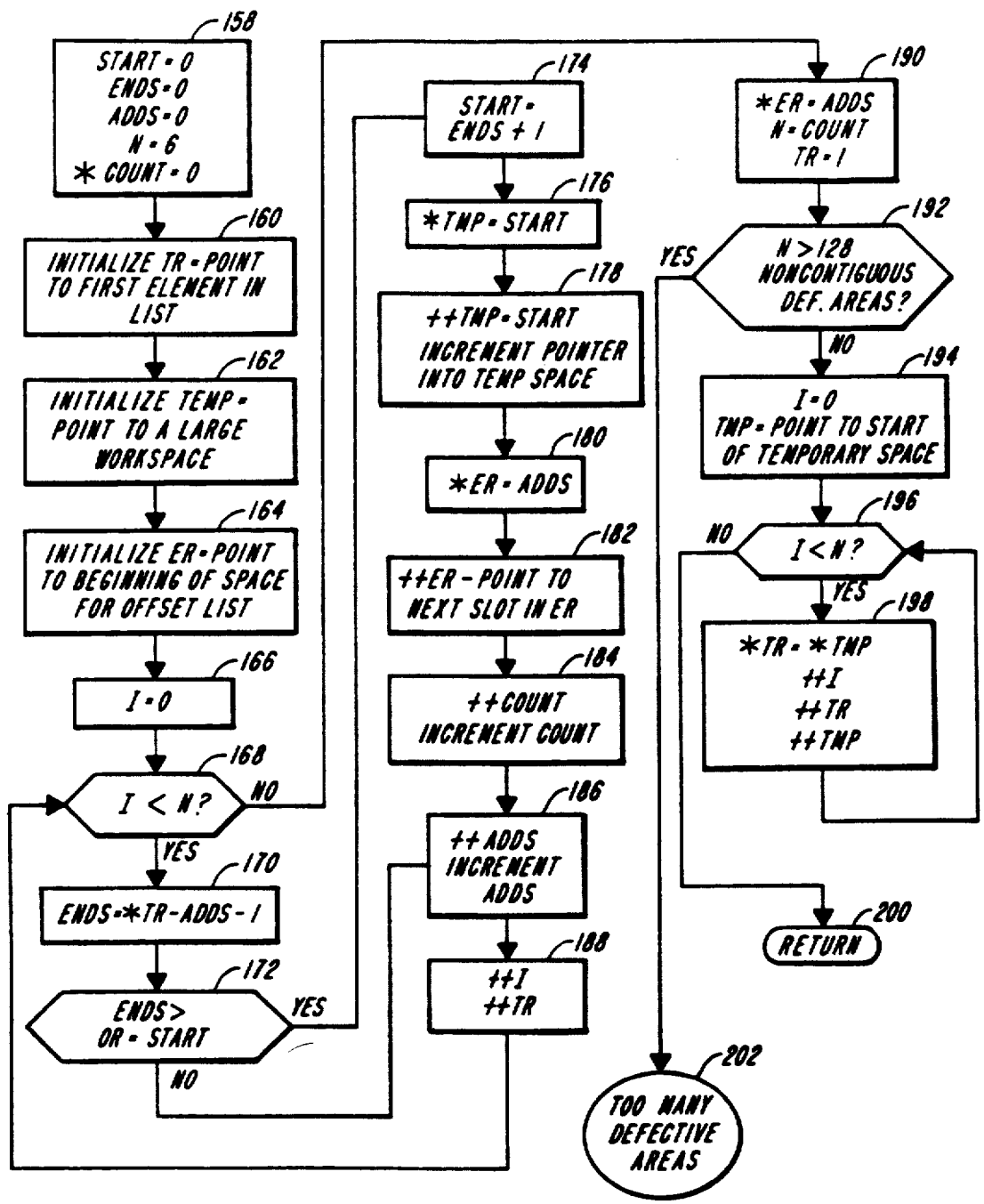
FIG. 9 is a flow diagram illustrating a method and apparatus for restructuring the sorted defect list to create a modified defect list and an offset list such as depicted in FIG. 8.
Figure 10:
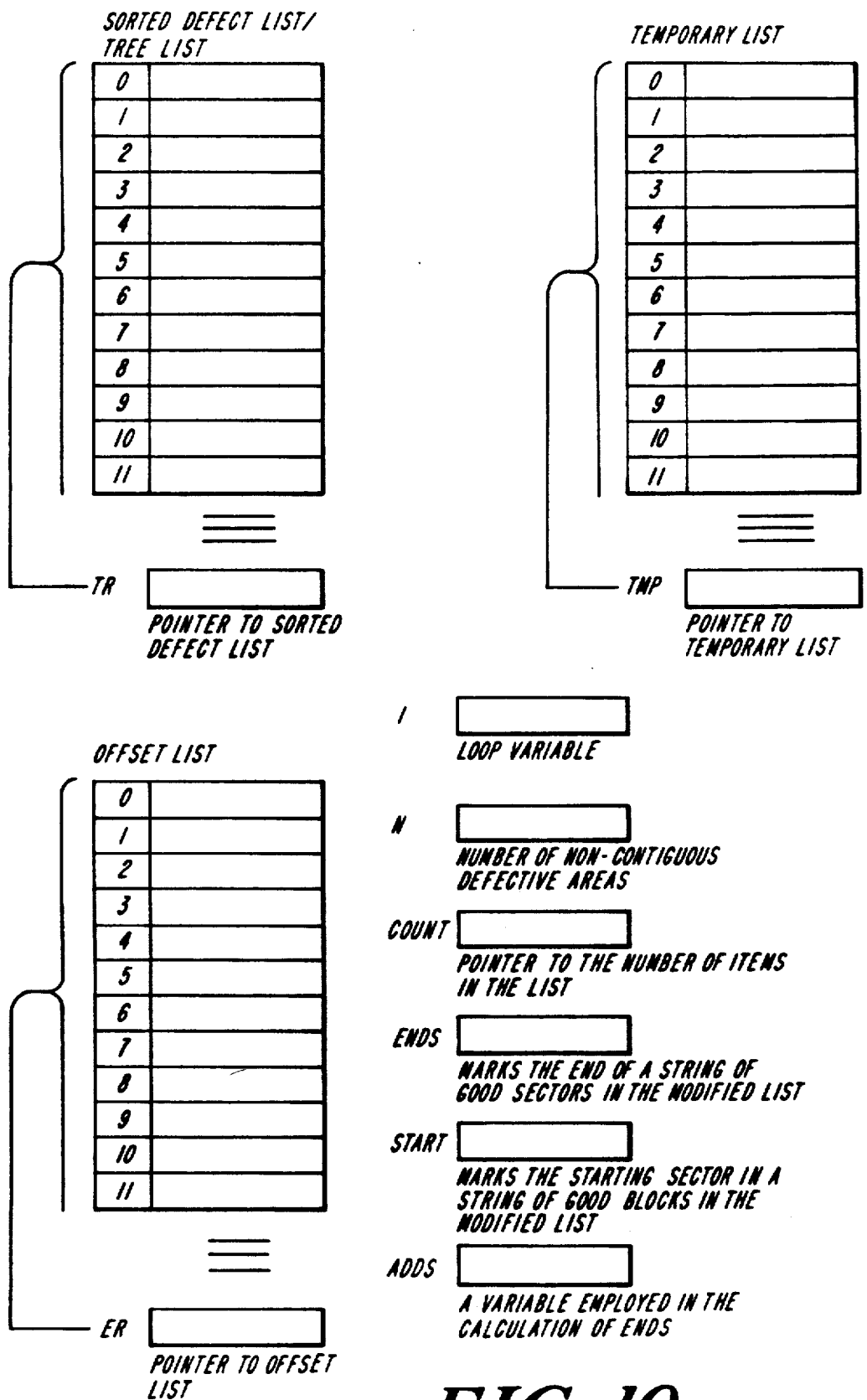
FIG. 10 illustrates the memory tables and memory registers employed in accordance with the flow diagram of FIG. 9.

The restructure list flow diagram illustrated in FIG. 9 transforms a sorted defect list into a modified defect list and an offset list as illustrated in FIG. 8. As shown in FIG. 10, the restructure list operation employs a sorted defect list memory table. A memory register designated "TR" is employed as an address pointer into the sorted defect list memory table. The modified defect list is generated in a second memory table designated as a temporary list. An address pointer, designated "TMP" is employed as an address pointer into the memory table in which the modified defect list is constructed. The offset list is constructed in yet another memory table. An address pointer designated "ER" is employed to select a specific address within the offset list memory table. A register designated "I" is employed as a loop variable and relates to the number of physical addresses processed by the restructure list logic in the first portion of the restructure list flow diagram and which relates to the number of elements in the modified defect list which have been processed in the second Portion of the restructure list flow diagram. The restructure list logic further includes a memory register designated "N", which relates to the number of noncontiguous defective areas. A memory register designated "count" is an address pointer to the number of items in the modified defect list. A memory register designated "ends" is employed to mark the end of a string of good sectors or addresses in the modified list. A memory register designated "start" is employed to mark the starting sector in a string of good sectors or addresses in the modified list and a memory register designated "adds" is employed as a variable in the calculation of the value of the memory register "ends".

The operation of the restructure list flow diagram of FIG. 9 will be illustrated by example by showing the restructuring of the sorted defect list illustrated in FIG. 8 to produce the modified defect list and the offset list also shown in FIG. 8. The values of the respective memory registers and tables during the restructuring of the sorted defect list are illustrated in FIG. 11. As illustrated in block 158, certain memory registers are first initialized. The respective values, after initialization are illustrated in the first row of FIG. 11 designated "initialization". Thereafter, in block 160, the address pointer "TR" is initialized to point to the first element in the sorted defect list. The memory register "TMP" is then initialized to point to the first address of a memory table employed as a temporary workspace as shown in block 162. This temporary workspace corresponds to the memory table where the modified defect list is created. As indicated in block 164, the address pointer "ER" is initialized to point to the beginning of another memory table in which the offset list is generated. Finally, the loop variable "I" is initialized to 0 as reflected in block 166 and control passes to the iterative routine commencing with decisional block 168. The values of the respective variables upon entering block 168 for the restructuring of the sorted defect list illustrated in FIG. 8 are shown in the row titled "first pass" in FIG. 11. The changes in the variables during the first pass are reflected in the second row under the respective heading.

During the first pass "I" (0) is less than "N" (6) so the logic proceeds to block 162 as shown in FIG. 9. "Ends" equals the contents of "TR" (3) minus "adds" (0) minus 1. Thus, the value 2 is stored in the register designated "ends". The logic proceeds to decisional block 172 wherein a comparison between the value in the "ends" memory register and the value in the "start" memory register is made. Since "ends" (2) is greater than or equal to "start" (0) flow proceeds to block 174. The value "ends" (2) plus 1 or 3 is stored in the memory register designated "start" as indicated in block 174. Thereafter, as reflected in block 176 the value of the register "start" is stored in the address pointed to by the "TMP" memory register. Since "TMP" is 0 the contents of the memory register "start" (3) are stored in address 0 of the temporary space corresponding to the first location of the modified defect list. Next, as shown in block 178 the address pointer "TMP" is incremented to point to the next address in the temporary list. Thereafter, as shown in block 180 the value in the memory register "adds" (0) is stored in the location pointed to by the address in the memory register "ER". Since the memory register "ER" was initialized to point to address 0, "adds" (0) is stored in address 0 of the offset list table. As shown in block 182 the memory register "ER" is then incremented to point to the next location in the offset list. As shown in block 184, the value in the register pointed to by the "count" register is incremented reflecting the insertion of a value in each of the offset list and the modified defect list respectively. The value of "adds" is incremented as shown in block 186 and the values of the "I" and "TR" registers are incremented as shown in block 188. Thereafter, the logic path returns to decisional block 168 and a second pass of the loop is initiated. During the second pass of the loop in the present example commencing with block 168, the value 6 is inserted into the second location of the temporary workspace which corresponds to the second location in the modified defect list. The value 1 is inserted into the second location of the offset list. Variables are recalculated, and incremented as hereinbefore described and control returns to block 168 for a third pass of the loop. During the third pass, the value of "ends" is calculated as the contents of the register pointed to by register "TR" (8) minus "adds" (2) minus 1. Thus the value 5 is stored in the register "ends". Control then passes to decisional block 172. Since "ends" (5) is not greater than or equal to "start" (6) control passes to block 186 and then to block 188 in which the values of "adds" "I" and "TR" are incremented respectively. It is noted that during the third pass of the loop no values are placed in the temporary list corresponding to the modified defect list or in the offset list. Such reflects the fact, as illustrated in FIG. 8, that the third defective address (8) is contiguous with the second defective address (7). The logic precludes entering further elements in either the temporary list or the offset list until the end of the contiguous defective sectors are identified. This is illustrated in the second through fifth passes of the loop as seen in FIG. 11. In the present example, after 6 passes of the loop, four elements have been entered into each of the modified defect list (temporary list) and the offset list. A fifth value is inserted in the offset list as shown in the second initialization sequence of FIG. 11. The table initially containing the sorted defect list is overwritten with the values from the modified defect list. As reflected in block 190 the contents of "adds" (6) is stored in address 4 of the offset list. The value of the contents of the register pointed to by the register designated "count" (4) is stored in the first location of the table which previously contained the sorted defect list. Thereafter, as reflected in block 190, the address pointer into the sorted defect list/tree list table is initialized to point to address 1. Control next proceeds to decisional block 192. In block 192 a comparison is made to determine if the number of noncontiguous defective areas exceed 128. This limitation is imposed by the fact that in the present example an eight level tree is employed thus providing a limitation of 128 offset values in the memory table locations corresponding to the lowest level of the tree structure. It is understood that any desired number of tree levels may be employed in accordance with the present invention. While trees having greater numbers of levels will take a longer time to traverse, it is further understood that the traversal may be more rapidly completed by employing hard wired logic as opposed to soft wired logic or by implementing parts of the apparatus in firmware. As reflected in block 192, if the number of defective segments exceeds 128 with the present eight level tree, the restructure list operation is terminated and an appropriate message or indication is provided as illustrated in block 202. Since, in the present example, the number of noncontiguous defective segments does not exceed 128, control proceeds to block 194. The loop variable "I" is initialized to 0 and the address pointer "TMP" is initialized to point to address 0 of the temporary list. Thereafter, as reflected in decisional block 196 a comparison is made between the loop variable "I" and the number of items in the modified defect list. Since "I" (0) is initially less than "N" (4) control proceeds to block 198 wherein the contents of address 0 of the temporary list is moved to address 1 of the memory table Previously containing the sorted defect list. The values of "I", "TR" and "TMP" are incremented as shown in block 198 and the loop consisting of blocks 196 and 198 is repeated until the "N" values in the temporary list are moved to addresses 1 through "N" of the memory table first containing the sorted defect list thus completing the formation of the tree list. When the loop variable "I" is no longer less than "N" control exits the loop and returns to the calling routine as reflected in block 200 thus completing the restructuring of the sorted defect list. It is noted that the list designated "tree list" in FIG. 8 contains the values in the modified defect list illustrated in FIG. 8 after completion of the restructuring illustrated in FIG. 9.

Figure 15:
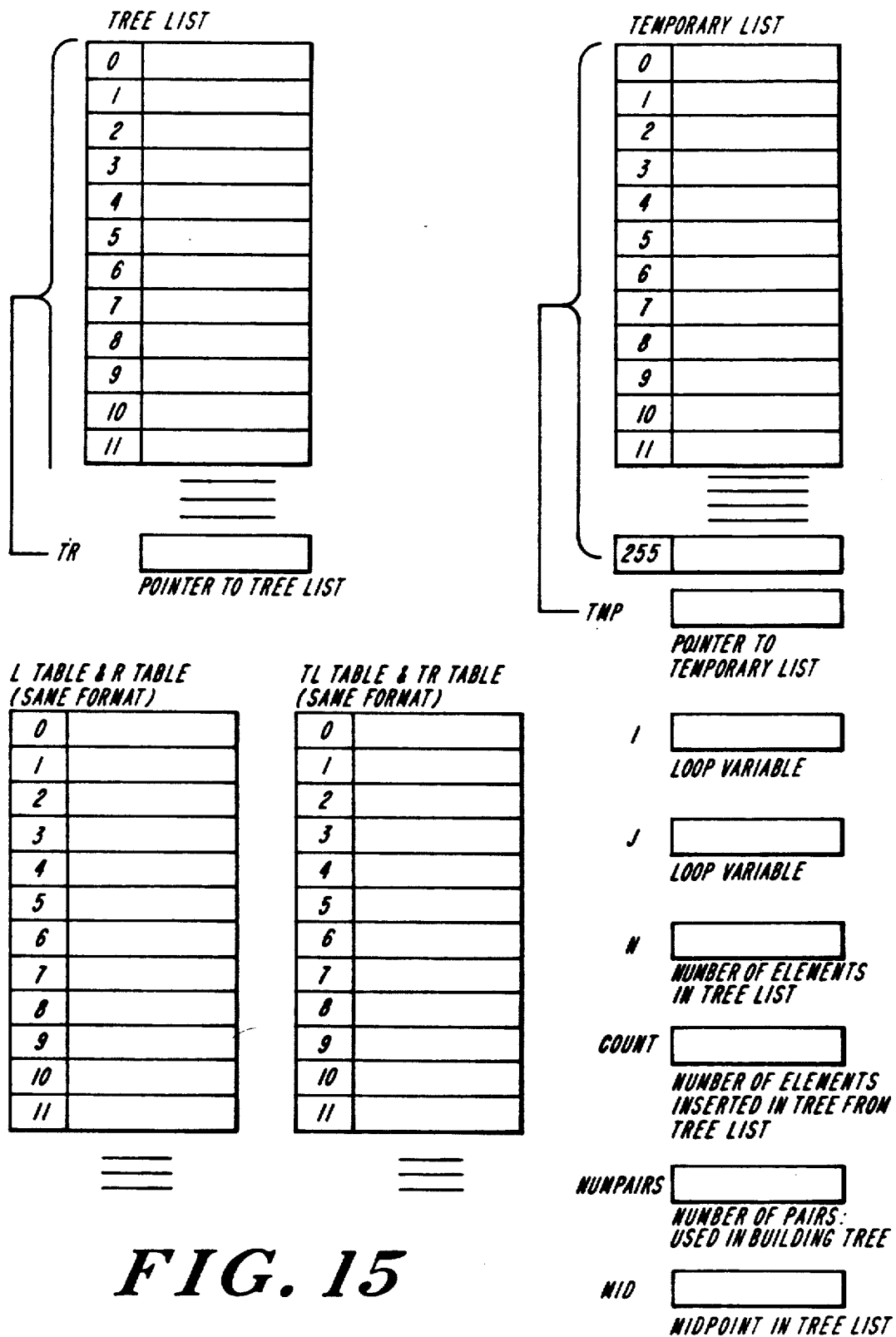
FIG. 15 illustrates memory tables and memory registers employed in accordance with the flow diagram of FIG. 13.

Following the restructuring of the sorted defect list to form the modified defect list and the offset list, a tree structure is built as illustrated in block 134 of FIG. 3. A method and apparatus for constructing a tree structure in accordance with the present invention is detailed in the build-tree flow diagram illustrated in FIG. 13. During the building of the tree a number of memory tables, associated address pointers and other memory registers are employed. Such tables and registers are illustrated in FIG. 15.

Figure 13:
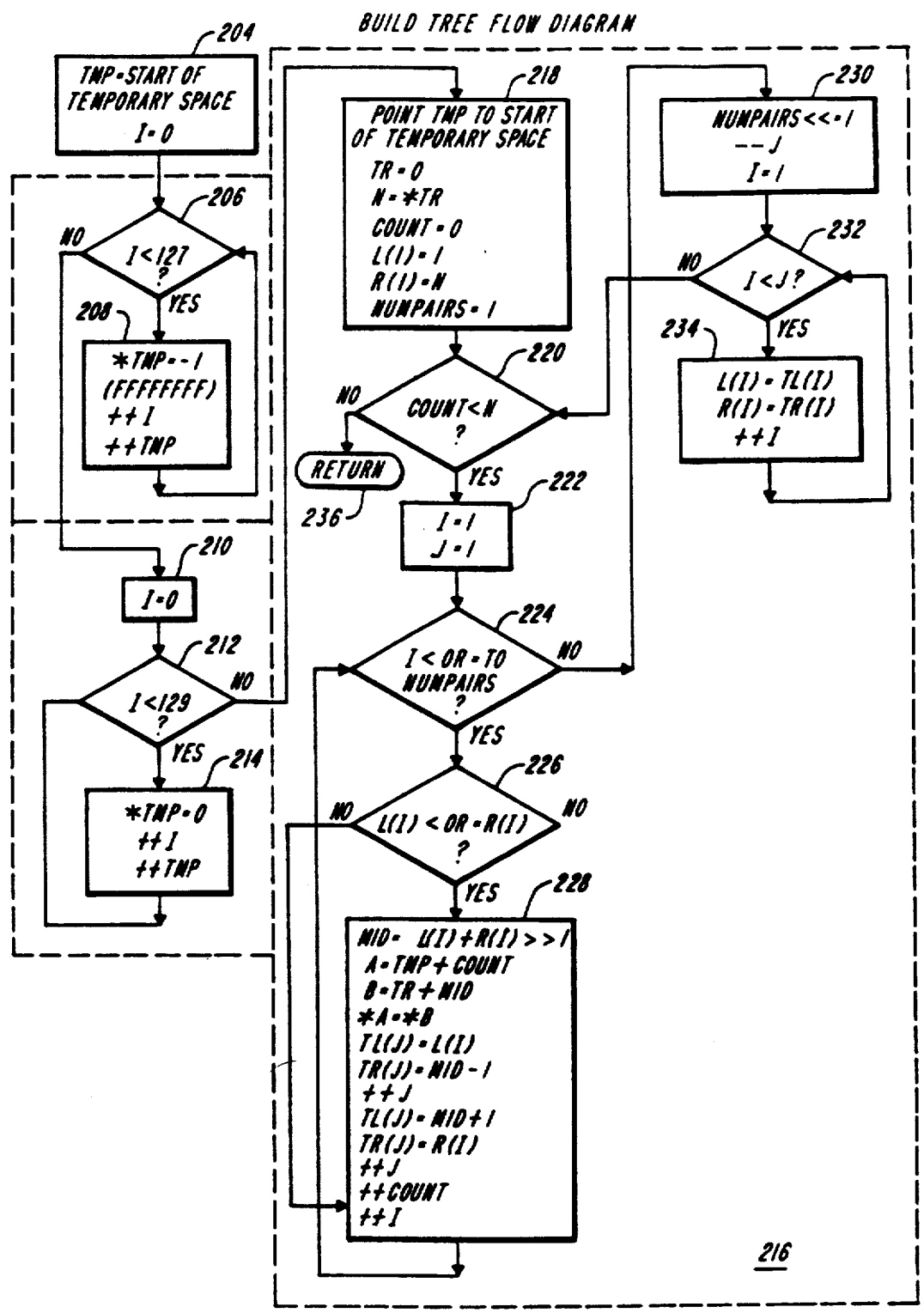
FIG. 13 is a flow diagram depicting a method and apparatus for building a tree structure of the type illustrated in FIGS. 12a and 12b.

The construction of the tree occurs as follows. Referring to FIG. 13, and as illustrated in block 204, an address pointer "TMP" is initialized to point to the beginning of a large memory table corresponding in size to the number of elements in the tree structure. In the illustrated embodiment employing an eight level tree structure, the temporary space is 255 memory locations in length (two to the "L" minus 1 where "L" equals eight (8) levels). In the loop comprising blocks 206 and 208 the top seven levels of the tree are filled with the value minus one (−1) (FFFFFFFF). Such is depicted in the illustrative memory table of FIG. 12a. After filling the first seven levels of the tree with minus ones (−1s) control passes to block 210 and a memory register containing the loop variable designated "I" is initialized to 0. Thereafter, as shown in the loop comprising blocks 212 and 214, all locations in level eight of the tree are loaded with the value 0 as depicted in the memory table illustrated in FIG. 12a.

Figure 12A:
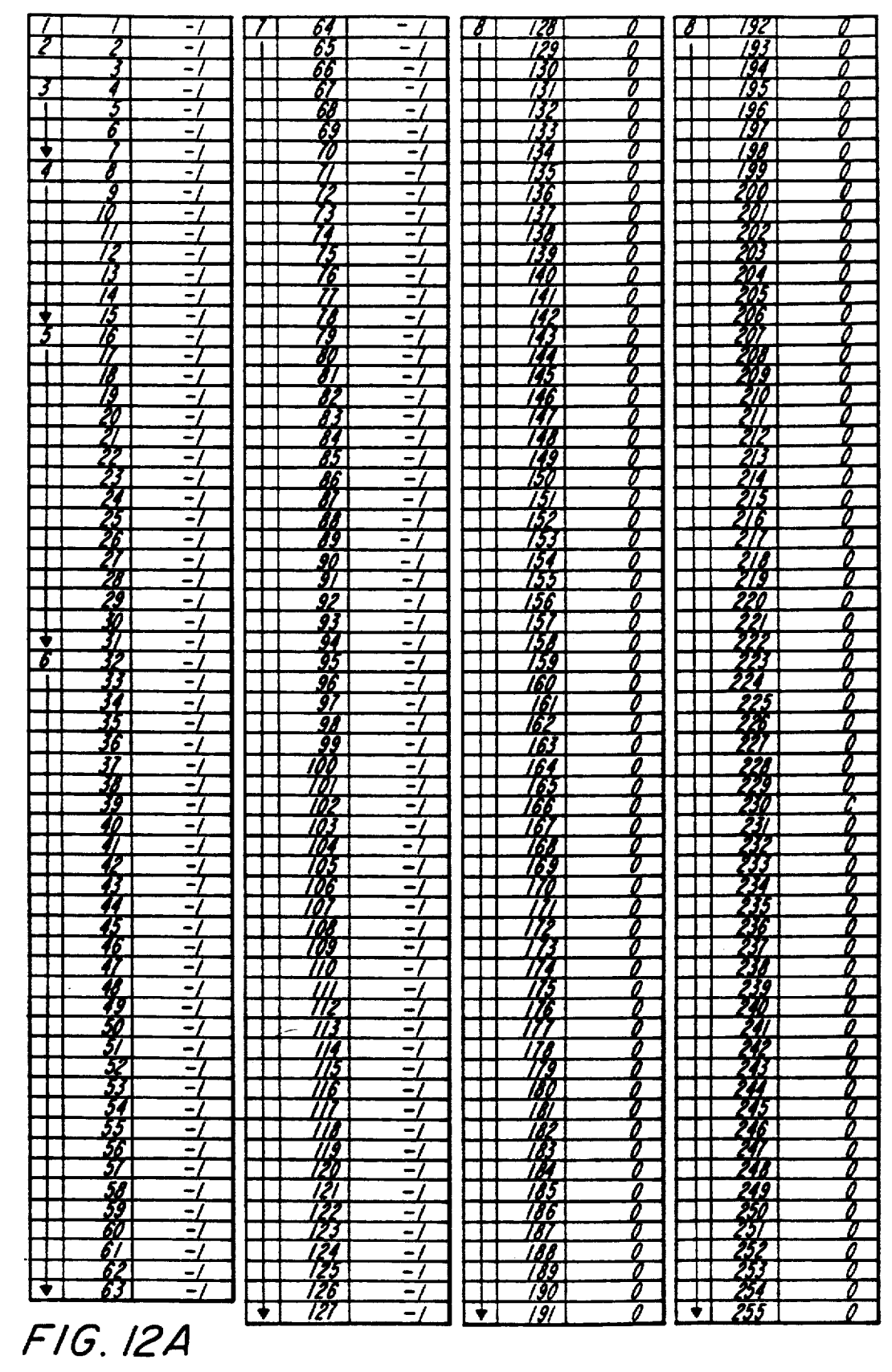

The structure of the memory table comprising the tree is apparent from FIG. 12a. Referring to FIG. 12a, it is seen that address 1 comprises level one of the tree, addresses 2 through 3 comprise the second level of the tree (the next lower tree level), addresses 4 through 7 comprise the third level of the tree (the next lower tree level), addresses 8 through 15 comprise the fourth level of the tree (the next lower tree level), addresses 16 through 31 comprise the fifth level of the tree (the next lower tree level), addresses 32 through 63 comprise the sixth level of the tree (the next lower tree level), addresses 64 through 127 comprise the seventh level of the tree (the next lower tree level) and 128 through 255 comprise the eighth level of the tree (the lowest or lower tree level). In the present tree structure, each element of the tree in all but the lowest level have two "children" i.e. the first element of the tree in address 1 has two children, namely the elements located at addresses 2 and 3, likewise, the element at address 2 in level 2 has two children, namely the elements located at addresses 4 and 5 in level 3. An element of the tree having an address two times the address of a selected element is defined as the "left child" of the selected element. An element of the tree having an address equal to two times the address of the selected element plus one is defined as the "right child" of the selected element. Thus, to move from one tree element to the left child or branch, the address of the respective tree location is multiplied by two via a left-shift operation. To traverse tree to reach the right child or branch of a tree element in the next tree level, the respective tree address is multiplied by two and the value one is added to the resultant address to produce the address of the right child or branch.

After filling the locations of the memory table corresponding to the first seven tree levels with minus 1's and the locations of the memory table corresponding to the eighth tree level with 0's, control passes to a portion of the build tree operation enclosed in dotted lines and generally designated 216. In the portion 216 of the build tree flow diagram, the method and apparatus illustrated selectively loads elements from the tree list (modified defect list) into the tree structure by overwriting certain addresses previously loaded with minus ones (−1's).

Figure 12B:
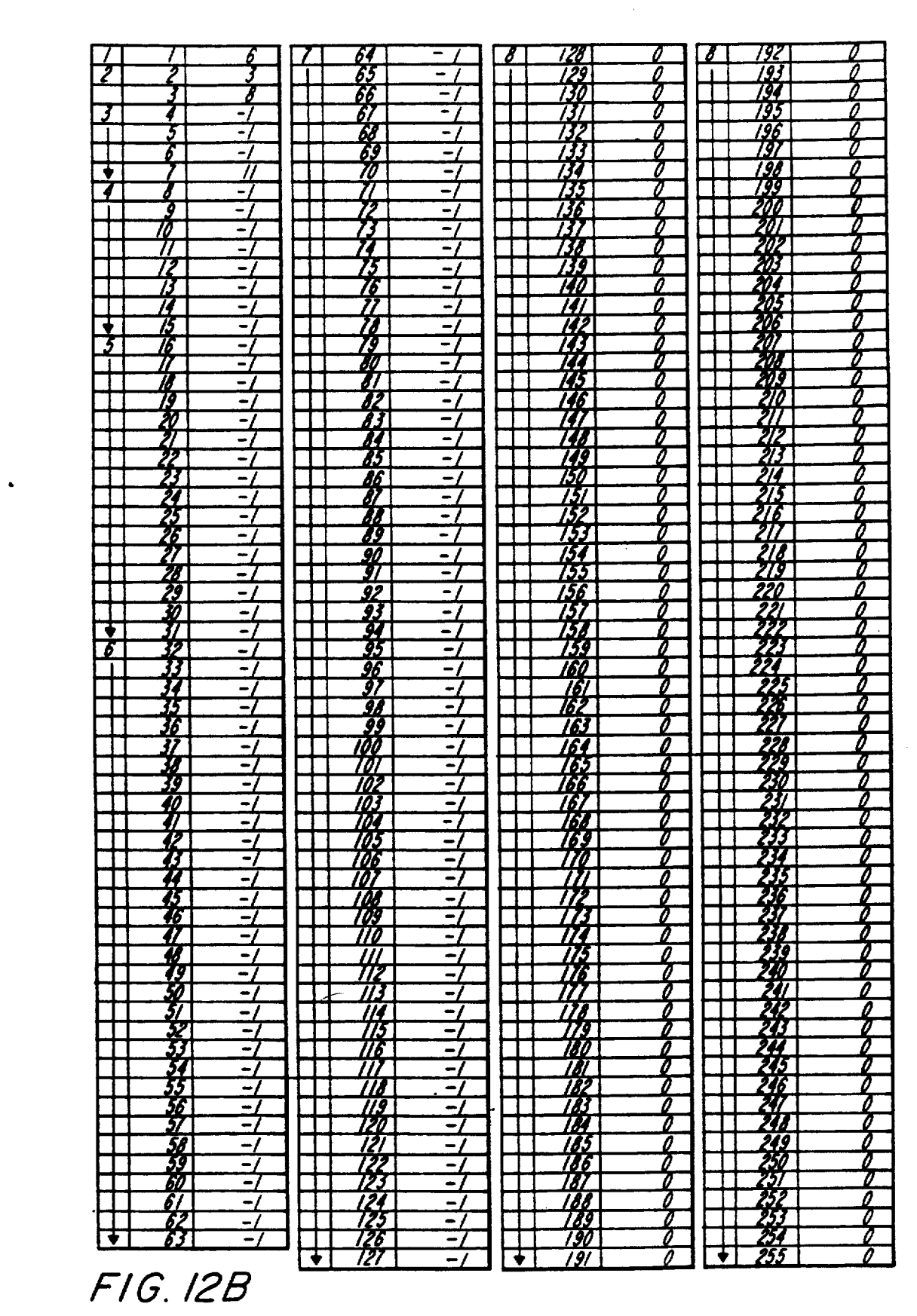

More specifically, referring to FIG. 13, control passes to initialization block 218 in which the address pointer designated "TMP" is initialized to point to the start of the memory table containing the tree structure. A memory register designated "N" is loaded with the value of the first element of the tree list (illustrated in FIG. 8). As previously indicated, the first element in the tree list contains the number of elements in the modified defect list; the following elements in the tree list comprising the elements from the modified defect list formed during the restructure list operation. The first element in another memory table "L" is initialized to a value of 1 and a third memory table "R" is initialized to contain the value in the memory register designated "N". Finally, a memory register designated "numpairs" is initialized to the value of 1. Thereafter, as illustrated in blocks 220, 222, 224, 226, 228, 230, 232, 234 and 236, the values from the modified tree list are selectively loaded into the upper level of the tree structure. The values of variables during the build tree operation while loading the tree structure with the values from the modified defect list, and more particularly, employing the tree list of FIG. 8, is illustrated in FIG. 14. The row labeled initialization in FIG. 14 corresponds to the block 218 wherein applicable memory registers are initialized prior to calculation of the tree addresses into which the respective modified defect list values are to be loaded. The memory register designated "A" is a pointer into the temporary list. Thus, as apparent from FIGS. 13 and 14 for the present example, during the operations illustrated generally in block 216, the value 6 is loaded into address 1 of the temporary list, the value 3 is loaded into the second address of the temporary list, the value 8 is loaded into address 3 of the temporary list and the value 11 from the modified defect list is loaded into address 7 of the temporary list. Such is further illustrated in FIG. 12b.

After building the tree in the manner hereinabove described, in the fill tree operation illustrated in FIG. 16, the modified defect list values are selectively propagated through but not including the locations of the memory table corresponding to the lowest tree level and the offset values from the offset list are selectively loaded into the memory table locations corresponding to the lowest level of the tree.

Figure 16:
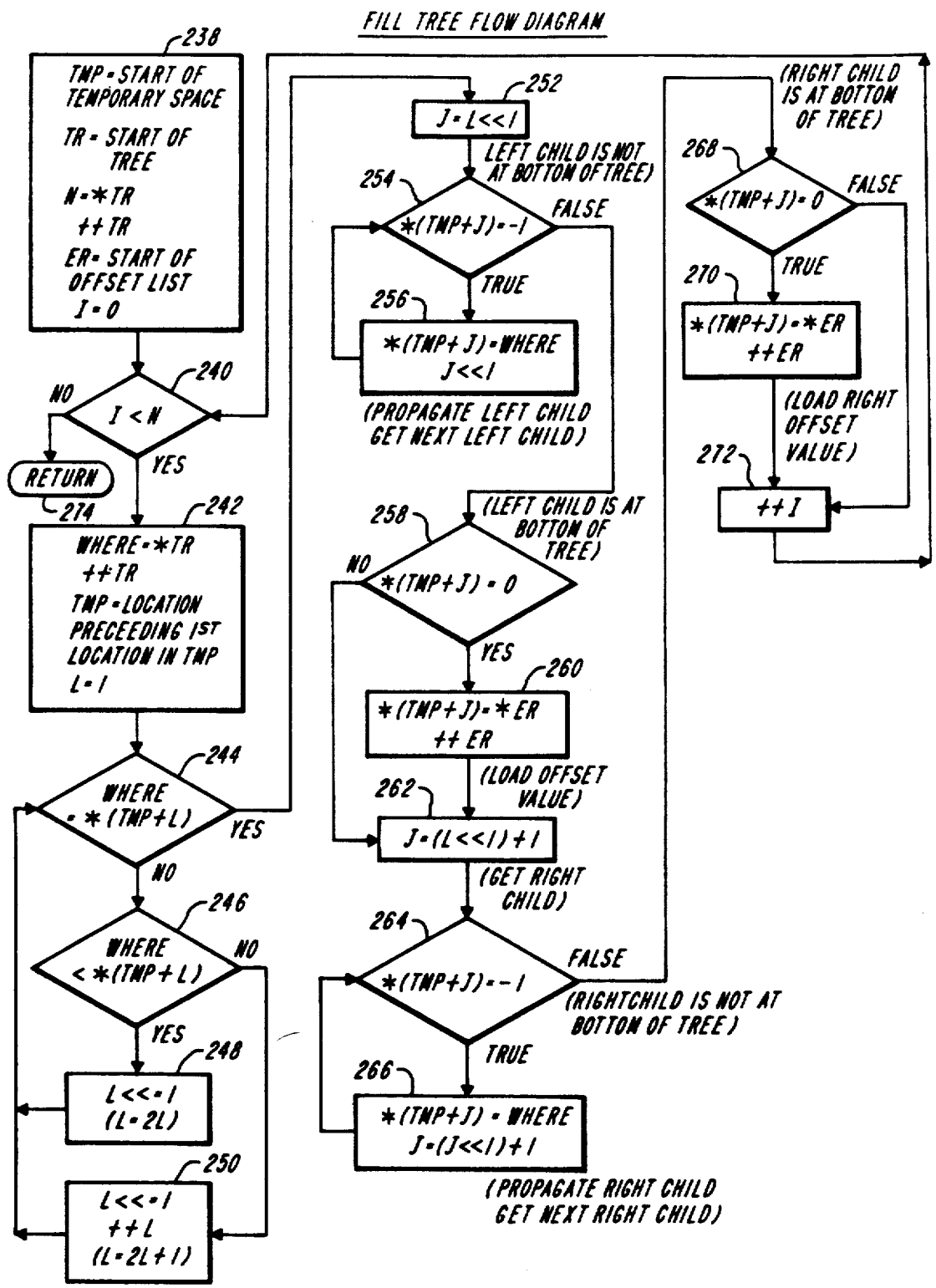
FIG. 16 is a flow diagram showing a method and apparatus for filling a tree structure in accordance with the present invention.
Figure 17:
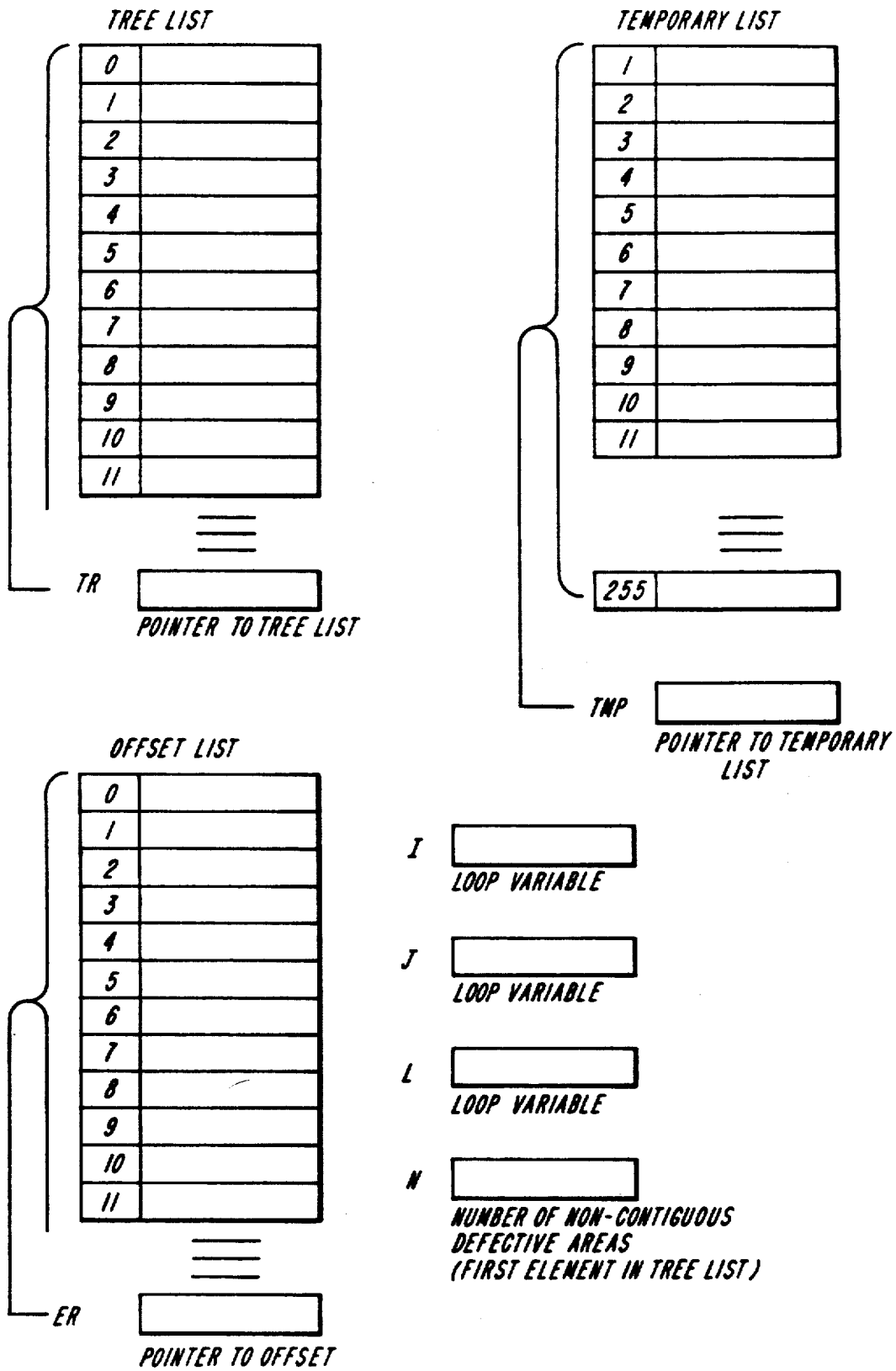
FIG. 17 illustrates memory tables and memory registers employed in accordance with the flow diagram of FIG. 16.

A method and apparatus for filling the tree structure is shown in FIG. 16. The various memory tables, memory registers, and address pointers employed in the fill-tree operation are illustrated in FIG. 17. The memory registers used include the tree list table and the offset list table formed during the restructure list operation, and the associated address pointers employed to point into the respective tables. Additionally, a memory table containing, for example, the partially constructed eight-level tree produced in accordance with the build-tree flow diagram of FIG. 13, is employed.

As illustrated in block 238 of FIG. 16, certain memory registers are first initialized. The memory register "TMP" is initialized to point to the start of the memory table containing the partially constructed tree. The memory register "TR" is initialized to point to the first location of the tree list produced during the restructure list operation. A memory register designated "N" is loaded with the contents of the first value in the tree list, which corresponds to the number of subsequent elements in the list. Additionally, the memory register designated "ER" is initialized to point to the first value of the offset list.

After the initialization sequence illustrated in block 238, as shown in block 240, a comparison is made to determine if each element in the tree list has been processed. If the memory register designated "I" is less than the value of the register designated "N", control passes to block 242. In block 242 the memory register designated "WHERE" is loaded with the second value in the tree list, and thereafter the memory register designated "TR" is incremented to point to the next element in the tree list. The memory register designated "TMP" is initialized to point to the first location preceding the temporary list and the memory register designated "L" is initialized to the value of one (1). "L" is an offset into the tree (temporary list) from the first memory location immediately preceding the tree; (i.e. (TMP+L) points to the present location in the temporary list.

In blocks 244, 246, 248 and 250 the apparatus steps through the tree (temporary list) in accordance with the technique illustrated in FIG. 16 until the value of the selected address in the tree equals the value of the memory register designated "WHERE", corresponding to the value of the selected member of the tree list.

As illustrated in block 252, the memory register designated "J" is then set equal to the value of the memory register designated "L" after subjecting the memory register "L" to a left shift operation. This operation multiplies the value in the register "L" by 2. In block 254 a comparison is next made between the contents of the address in the temporary list pointed to by (TMP+J) and the value −1. It is noted that the upper levels of the tree were first loaded with −1's and then selected locations in the tree were overwritten with values from the tree list. If the register in the memory table corresponding to the tree location being addressed is equal to −1, the selected register is not on the lowest tree level. In this event, as illustrated in block 256, the selected register in the tree (temporary list) is set equal to the value in the memory register designated "WHERE" and the next "left child" in the tree is accessed. The loop comprising blocks 254 and 256 propagates the value in the register "WHERE" successively into the left children until the pointer into the temporary list points to an address having a value which is not equal to −1. In such event, control passes to block 258. As illustrated in block 258 of FIG. 16, a comparison is then made between the value at the selected address in the tree list and the value 0. If the value in the tree list equals 0, such indicates that the selected address points to a memory table location in the lowest level of the tree (temporary list). In such event, control passes to block 260. The selected offset value is loaded into the specified address in the lowest tree level and the pointer to the offset list is then incremented. As illustrated in block 262, the value in the memory register "J" is next set to equal the value in the memory register "L" shifted left and incremented by 1.

As shown in block 258 if the value in the temporary list Pointed to by (TEMP+J) is not equal to 0, such indicates that the left child at the selected address is not at the lowest level of the tree. In this event, an offset value is not loaded into the specified address. Instead, as illustrated in block 262, the memory register designated "J" is set equal to the memory register designated "L", shifted left and incremented by 1, thereby indexing to obtain the respective right child.

Control next proceeds to block 264 wherein a comparison is made between the selected "right child" and the value −1 to determine if the selected address is not at the bottom of the tree. If the selected address is not at the bottom of the tree, as illustrated in block 264, the value in the memory register designated "WHERE" is propagated through successive right children in the tree via control elements 264 and 266. In the event the comparison illustrated in block 264 is false, indicating that the value of the selected address in the tree is not equal to −1, control passes to decisional block 268. In decisional block 268 a comparison is made to see if the selected address in the temporary list is equal to 0, which would indicate that the selected address is in the lowest tree level. If the selected address is equal to 0, and thus in the lowest tree level, the value in the offset list pointed to by the memory register designated "ER" is loaded into the selected address in the lowest level of the tree (temporary list) and the pointer "ER" to the offset list is incremented as shown in block 270. The loop variable "I" is incremented as illustrated in block 272 and control is passed to decisional block 240, wherein the above-described operation is repeated until all values from the tree list corresponding to the modified defect list values have been propagated through the tree with corresponding offset values inserted into the lowest tree level. Once all values from the modified defect list have been propagated through the tree, control passes to block 274, indicating that the filling of the tree has completed.

Figure 19:
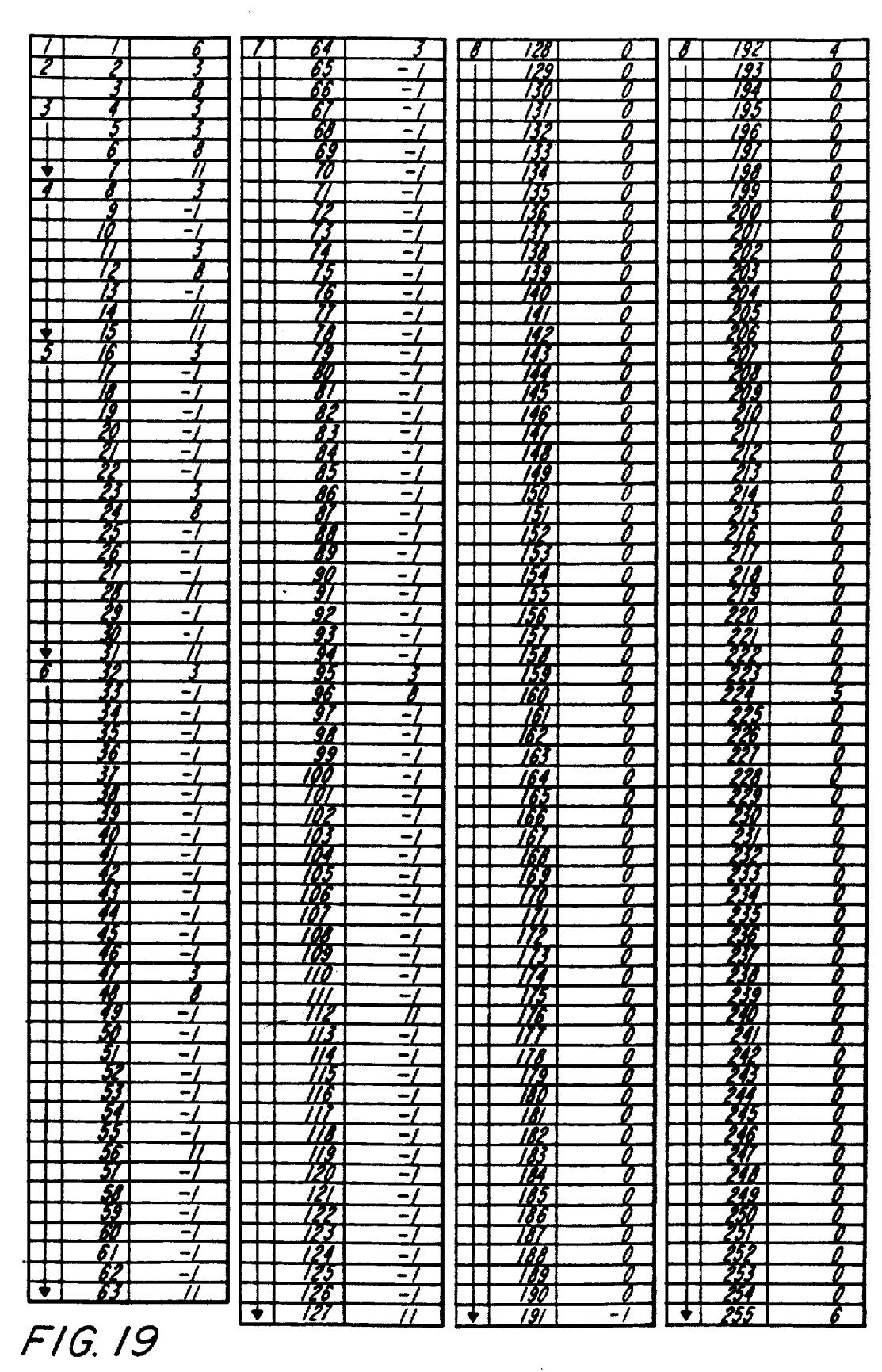

The fill-tree flow diagram variables obtained when filling a tree using the exemplary tree list values and offset list values of FIG. 8 are illustrated in FIG. 18. The memory table containing the modified defect list and offset list values after filling the tree based upon the exemplary lists of FIG. 8 is shown in FIG. 19.

After filling the tree with the values from the modified defect list and the offset list in the above described manner, the resultant memory table, organized in the form of a tree structure, is used to ascertain the applicable offset value for calculation of a physical address when a logical address is presented to the storage controller 110.

Figure 20:
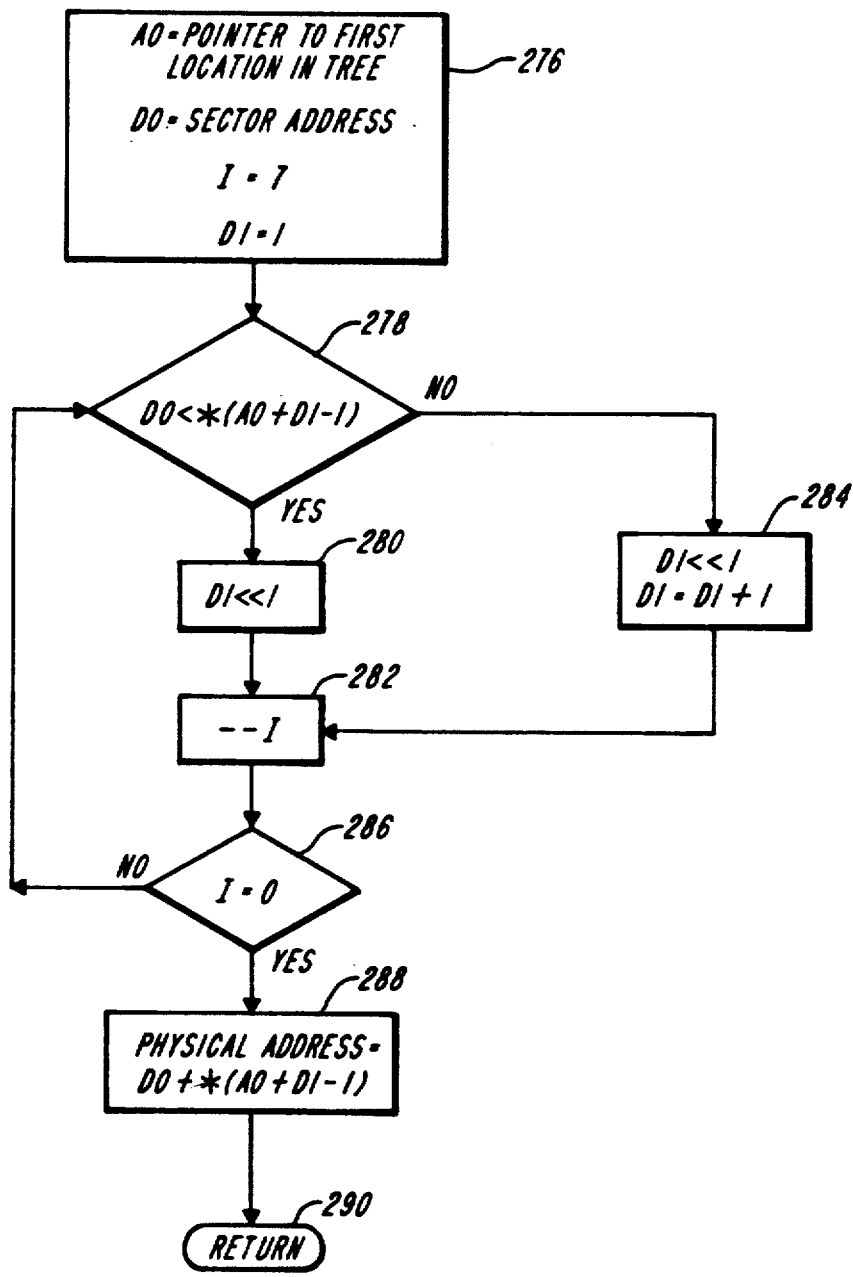
FIG. 20 is a flow diagram depicting a method and apparatus for traversing a tree structure in accordance with the present invention.
Figure 21:
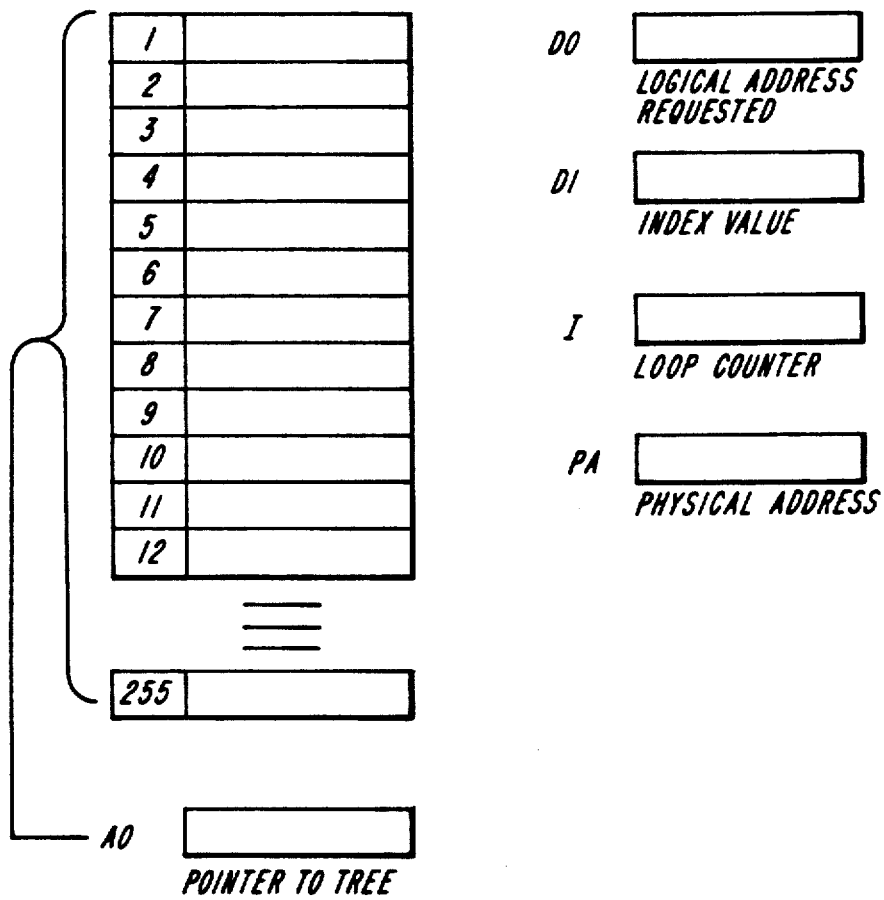
FIG. 21 illustrates memory tables and registers employed in accordance with the flow diagram of FIG. 20.

The mapping of a logical address into a physical address is illustrated in the search flow diagram of FIG. 20. The memory registers, tables, and address pointers employed in the search operation are illustrated in FIG. 21.

Referring to FIG. 20, and as illustrated in block 276, a memory register designated "A0" is initialized to point to the first location in the tree (address 1), which in the illustrative example is an eight-level tree. A memory register designated "D0" is loaded with a logical address presented by a requesting device. A memory register containing the loop variable "I" is set equal to the value of 7, and a memory register containing an index value designated "D1" is set equal to 1. In the event that each location in the memory table corresponding to an element in the tree structure is four bytes wide, the index value D1 is set equal to 4, and the values of "1" in blocks 278, 284 and 288 are set equal to 4 to properly index into the tree (memory table).

In block 278 a comparison is made to see if the logical address (D0) is less than the first value in the tree. If such is the case, control passes to block 280. The index value D1 is multiplied by 2 to select the left child of the previously selected tree address, and the memory register designated "I" is decremented. If, in block 278, the result of the comparison indicates that the sector address D0 is not less than the contents of the selected tree address, the address of the right child of the selected address is obtained as illustrated in block 284. Such is achieved by multiplying the index value by left shifting the value in the memory register D1 and by incrementing the resultant value.

The tree structure is traversed in the above manner until the memory register designated "I" is equal to 0, as illustrated in block 286. When "I" equals 0, such indicates that the apparatus has traversed the upper levels of the tree and that the pointer into the tree is pointing to a value at the lowest tree level. This addressed value is the specific offset value which is added to the respective logical address to obtain the corresponding physical address, as illustrated in block 288. Once the physical address is obtained in the manner described, control returns, as illustrated in block 290, to the apparatus which accesses the selected physical address in the media 120 through access control logic 122 in the storage subsystem 116.

FIG. 22 illustrates the respective variables upon traversal of the tree structure and more particularly, the traversal of the tree structure illustrated in FIG. 19 upon presentation of the logical address "9". As apparent from the example, after traversal of the tree, the apparatus obtains the offset value 5 from tree address 224. The offset value 5 is added to the logical address 9 to produce the physical address 14.

A value corresponding to the last valid logical address is stored in the storage controller, 112. If the sum of the logical address and the corresponding offset value obtained from the tree is greater than the last valid logical address, an error message is returned to the operating system by the storage controller and access to the logical access presented is denied.

The above apparatus may be implemented employing a microprocessor for control, such as a 68,000 Series microprocessor manufactured by Motorola, or any other equivalent microprocessor. When implementing the above apparatus employing a microprocessor, it is desirable to select the microprocessor such that the traversal of the tree and the calculation of the physical address in the search-tree operation of FIG. 20 can be accomplished within the sector access time of a rotating disk, when employing the invention in a disk storage subsystem. By selecting the microprocessor to achieve the specified access speed, no penalty in system performance results in a multi-sector access except as incurred in calculation of the first physical address.

It is further apparent that the control apparatus may be implemented in firmware or hardwired to achieve more rapid transversal of the tree. Such permits the transversal of greater numbers of tree levels within the respective access time. Each additional tree level doubles the number of noncontiguous defective areas that can be accommodated.

By mapping the logical addresses into corresponding physical addresses in accordance with the disclosed invention, the storage system appears to the requesting device to contain a large continuous defect-free address space and avoids the previously described problems associated with the fragmentation of files.

The above-described invention is illustrative of a novel method and apparatus for generating and employing a tree structure to map logical addresses into physical addresses to create the appearance to a requesting device that the storage media contains a large, defect-free address space. Other modifications, embodiments, and departures from the present disclosure are possible without departing from the inventive concept contained herein. Consequently, the invention is to be viewed as embracing each and every novel feature and novel combination of features present in or possessed by the technique and apparatus herein disclosed, and is limited solely by the scope and spirit of the appended claims.

What is claimed is:

1. Apparatus for transforming logical addresses produced by a device requesting access to storage media in a disk subsystem into defect free physical addresses corresponding to specific locations on said media so as to create the appearance to said requesting device that said media includes a large, continuous, defect-free address space comprising:

means for generating a defect list comprising addresses of defective sectors in said storage media of said disk subsystem;

means for restructuring said list to produce a list comprising defect free logical addresses employed as decisional criteria and to produce an offset list containing a plurality of predetermined offset values;

means for ordering said list of defect free logical addresses and said offset list into an array having a predetermined organizational structure wherein said array may be traversed in a preselected manner within a predetermined maximum number of traverses;

said organizational structure comprising a memory table including a plurality of elements corresponding to elements of a tree structure, said tree structure having a plurality of upper levels and a lower level;

means for storing values from said list of defect free logical addresses in selected elements in said memory table corresponding to elements of said upper tree levels;

means for storing said predetermined offset values from said offset list in selected elements in said memory table corresponding to elements of said lower tree level;

means for traversing selected element in said table corresponding to elements of said upper level tree levels for each logical address produced by said requesting device to arrive at an element in the lower tree level of said table containing a predetermined offset value associated with the respective logical address; and means for adding said predetermined offset value to the respective logical address to produce a defect free physical address corresponding to a sector on said media for access.

2. Apparatus for creating a tree structure for use in transforming logical addresses produced by a device requesting access to a storage media into defect free physical addresses corresponding to specific locations on said media within a predetermined maximum number of transformation steps, so as to create the appearance to said requesting device that said media includes a large continuous defect-free address space, comprising:

means for creating a list of defective physical addresses in the storage media;

means for producing from said list of defective physical addresses a list of defect free logical addresses and a list of offset values;

means for establishing a memory table which is traversable within a predetermined maximum number of steps including a plurality of elements corresponding to elements of a tree structure, said tree structure having a plurality of upper levels and a lower level;

means for loading values corresponding to said list of defect free logical addresses into selected elements in said memory table corresponding to elements of said upper levels of said tree structure; and means for loading values corresponding to said offset values into selected elements in said memory table corresponding to elements of said lower level of said tree structure.

3. A method for creating a tree structure for use in transforming logical addresses produced by a device requesting access to a storage media into defect free physical addresses within a predetermined maximum number of transformation steps, so as to create the appearance to said requesting device that said media includes a large continuous defect-free address space, comprising the steps of:

creating a list of defective physical addresses in the storage media;

producing from said list of defective physical addresses a list of defect free logical addresses and a list of predetermined offset values;

establishing a memory table having a plurality of elements corresponding to elements of a tree structure, said tree structure having a plurality of upper levels and a lower level;

loading values corresponding to said defect free logical addresses into selected elements in said memory table corresponding to elements of said upper levels of said tree structure; and loading values corresponding to said predetermined offset values into selected elements in said memory table corresponding to elements of said lower level of said tree structure.

4. A method for transforming logical addresses produced by a device requesting access to storage media having a specified access time into defect free physical addresses from a list of defective physical addresses, so as to create the appearance to said requesting device that the storage media includes a large continuous defect-free address space comprising the steps of:

generating from a list of defective physical addresses, a list of defect free logical addresses and a list of corresponding predetermined offset values to be added to a requested logical address;

storing said list of defect free logical addresses and said list of corresponding predetermined offset values in a memory table in a predetermined manner such that said memory table is capable of being traversed within a predetermined maximum number of steps, said memory table having a plurality of elements corresponding to elements in a tree structure, said tree structure having a plurality of upper levels and a lower level;

receiving a logical address from said requesting device;

traversing selected elements in said memory table corresponding to elements of said upper tree levels in response to said received logical address, to arrive at a selected element in said table containing one of said predetermined offset values; and adding said one of said predetermined offset values to said logical address produced by said requesting device to produce a defect free physical address corresponding to a location on said storage media for access.

5. The method of claim 4 wherein said receiving, traversing and adding steps occur within the access time of said storage media.

6. The method of claim 4 wherein said storage step includes the steps of:

storing values corresponding to said defect free logical addresses in selected locations of said memory table corresponding to upper levels of said tree structure; and storing values corresponding to said predetermined offset values in selected locations of said memory table corresponding to the lower level of said tree structure.

7. The method of claim 4 wherein said receiving step includes the step of loading said logical address in a memory register and wherein said adding step includes the step of adding said one of said predetermined offset values to said logical address stored in said memory register to produce said physical address.

8. The method of claim 4 wherein said traversing step includes the step of comparing each logical address produced by said requesting device to defect free logical addresses stored values at selected locations in said memory table corresponding to said upper tree levels employing a microprocessor to produce a comparison output indication and branching to the next successive tree level based upon the respective comparison output indication.

9. The method of claim 4 further including prior to said storing step the step of generating a list of defective physical addresses including the step of reading information corresponding to the physical addresses of defective locations on said storage media from a predetermined area on said storage media.

10. The method of claim 9 further including step of reading the addresses of locations corresponding to additional defective physical addresses on said storage media in addition to said addresses identified on said media.

11. The method of claim 10 further including the step of sorting the addresses identified on said media corresponding to defective physical addresses and said addresses not identified on said media corresponding to additional defective physical addresses to produce a sorted list of addresses corresponding to defective physical addresses on said media.

12. The method of claim 11 further including the step of processing said sorted list to produce said list of defect free logical addresses and said list of predetermined offset values.

13. An apparatus for transforming logical addresses produced by a device requesting access to a storage media into defect free physical addresses corresponding to specific defect free locations on said media, so as to create the appearance to said requesting device that said media includes a large, continuous, defect free logical address space comprising:

means for generating a list of defective physical addresses in the storage media;

means for generating, from said list of defective physical addresses, a list of defect free logical addresses each of which corresponds to the first address of at least one defect free logical address sequence which is accessible by said requesting device, and for also generating a list of corresponding offset values to be added to a requested logical address to produce a modified logical address which corresponds to a defect free physical address;

means for comparing said requested logical address with selected addresses from among said list of defect free logical addresses; and means for ordering said list of defect free physical addresses and said list of corresponding offset values into an addressable memory array having a predetermined structure wherein said requested logical address may be compared to selected addresses from among said list of defect free logical addresses to arrive at a corresponding offset value, within a predetermined maximum number of comparisons, to transform said requested logical address into a defect free physical address.

14. The apparatus of claim 13 wherein said predetermined structure includes a binary tree structure organized into a plurality of upper tree levels and a lower tree level.

15. The apparatus of claim 14 wherein said means for ordering orders said list of defect free logical addresses into said plurality of upper tree levels, and orders said corresponding offset values into the lower tree level of said binary tree structure.

16. The apparatus of claim 14 wherein said upper levels include a first tree level having one element and each successive level of said upper tree levels has twice the number of elements as the previous level.

17. The apparatus of claim 14 wherein said means for comparing includes means for comparing each logical address produced by the requesting device to said list of defect free logical addresses to produce comparison output indications, and means for branching to a selected element in the next tree level based upon each successive comparison output indication.

18. The apparatus of claim 17 wherein said means for branching to a selected element includes means for branching to one of two associated elements in the next tree level based upon the respective comparison output indication.

19. The apparatus of claim 14 wherein each element in the tree structure corresponds to a register in said memory table of a predetermined number of bytes in width.

20. An apparatus for transforming logical addresses produced by a device requesting access to a storage media into defect free physical addresses corresponding to specific defect free locations on said media, so as to create the appearance to said requesting device that said media includes a large, continuous, defect free logical address space comprising:
   first processor apparatus operative for generating a list of defective physical addresses in the storage media;
   second processor apparatus operative for generating, from said list of defective physical addresses, a list of defect free logical addresses each of which corresponds to the first addresses of one or more sequential defect free logical addresses which is accessible by said requesting device, and for also generating a list of corresponding offset values to be added to a requested logical address to produce a modified logical address which corresponds to a defect free physical address;
   comparator apparatus for comparing said requested logical address with selected addresses from among said list of defect free logical addresses; and
   control apparatus operative for ordering said list of defect free logical addresses and said list of corresponding offset values into an addressable memory array having a predetermined structure wherein said requested logical address may be compared to selected addresses from among said list of defect free logical addresses to arrive at a corresponding offset value, to transform said requested logical address into a defect free physical address.

* * * * *

UNITED STATES PATENT AND TRADEMARK OFFICE
CERTIFICATE OF CORRECTION

PATENT NO.   : 5,146,571
DATED        : September 8, 1992
INVENTOR(S)  : Donald G. Logan It is certified that error appears in the above-identified patent and that said Letters Patent is hereby corrected as shown below:

Column 17, line 13, "transversal" should read --traversal--.

Column 17, line 14, "transversal" should read --traversal--.

Column 17, line 14, "transversal" should read --traversal--.

Column 18, line 5, "element" should read --elements--.

Column 20, line 36, "physical" should read --logical--.

Signed and Sealed this

Twenty-second Day of March, 1994

Attest:

BRUCE LEHMAN

Attesting Officer                Commissioner of Patents and Trademarks